United States Patent
La Rosa et al.

(10) Patent No.: US 9,613,709 B2
(45) Date of Patent: Apr. 4, 2017

(54) DUAL NON-VOLATILE MEMORY CELL COMPRISING AN ERASE TRANSISTOR

(71) Applicant: STMicroelectronics (Rousset) SAS, Rousset (FR)

(72) Inventors: Francesco La Rosa, Rousset (FR); Stephan Niel, Greasque (FR); Arnaud Regnier, Les Taillades (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 15/276,462

(22) Filed: Sep. 26, 2016

(65) Prior Publication Data

US 2017/0011804 A1 Jan. 12, 2017

Related U.S. Application Data

(62) Division of application No. 14/724,229, filed on May 28, 2015, now Pat. No. 9,484,107.

(30) Foreign Application Priority Data

May 28, 2014 (FR) ...................... 14 54891

(51) Int. Cl.
| | | |
|---|---|---|
| G11C 11/34 | (2006.01) |
| G11C 16/04 | (2006.01) |
| G11C 16/26 | (2006.01) |
| H01L 27/11521 | (2017.01) |
| H01L 21/28 | (2006.01) |
| H01L 21/027 | (2006.01) |
| G11C 16/14 | (2006.01) |
| H01L 27/11524 | (2017.01) |
| G11C 16/08 | (2006.01) |
| H01L 27/02 | (2006.01) |

(52) U.S. Cl.
CPC .......... *G11C 16/26* (2013.01); *G11C 16/0408* (2013.01); *G11C 16/0433* (2013.01); *G11C 16/0441* (2013.01); *G11C 16/08* (2013.01); *G11C 16/14* (2013.01); *H01L 21/0276* (2013.01); *H01L 21/28273* (2013.01); *H01L 27/11521* (2013.01); *H01L 27/11524* (2013.01); *H01L 27/0207* (2013.01)

(58) Field of Classification Search
CPC ..... G11C 16/26; G11C 16/14; G11C 16/0408; G11C 16/0441; G11C 16/08; H01L 27/0207; H01L 21/0276; H01L 21/28273; H01L 27/11521
See application file for complete search history.

(56) References Cited

U.S. PATENT DOCUMENTS 5,182,725 A 1/1993 Andoh et al.
6,433,382 B1 8/2002 Orlowski et al.
(Continued)

*Primary Examiner* — Toan Le
(74) *Attorney, Agent, or Firm* — Seed IP Law Group LLP

(57) ABSTRACT

The present disclosure relates to a non-volatile memory cell on a semiconductor substrate, comprising a first transistor comprising a control gate, a floating gate and a drain region, a second transistor comprising a control gate, a floating gate and a drain region, in which the floating gates of the first and second transistors are electrically coupled, and the second transistor comprises a conducting region electrically coupled to its drain region and extending opposite its floating gate through a tunnel dielectric layer.

12 Claims, 15 Drawing Sheets

(56) References Cited

U.S. PATENT DOCUMENTS

| | | |
|---|---|---|
| 7,800,159 B2 | 9/2010 | Widjaja et al. |
| 2002/0153546 A1 | 10/2002 | Verhaar |
| 2004/0080982 A1 | 4/2004 | Roizin |
| 2004/0084710 A1* | 5/2004 | Baker, Jr. ............ G11C 16/0425 257/311 |
| 2004/0130947 A1 | 7/2004 | Fan et al. |
| 2005/0201158 A1 | 9/2005 | Rosa |
| 2005/0275002 A1 | 12/2005 | Shone |
| 2006/0234444 A1 | 10/2006 | Wu et al. |
| 2008/0054339 A1* | 3/2008 | Choi .................... H01L 27/115 257/316 |
| 2008/0070363 A1 | 3/2008 | Mokhlesi |
| 2008/0165582 A1 | 7/2008 | Georgescu et al. |
| 2009/0279360 A1 | 11/2009 | Lee et al. |
| 2010/0220533 A1 | 9/2010 | Chen et al. |
| 2010/0265765 A1 | 10/2010 | Seo et al. |
| 2011/0051524 A1* | 3/2011 | Hsu .................... G11C 11/5628 365/185.22 |
| 2012/0195123 A1* | 8/2012 | Lee .................... G11C 16/3409 365/185.12 |
| 2012/0236646 A1 | 9/2012 | Hsu et al. |
| 2013/0228846 A1 | 9/2013 | La Rosa et al. |
| 2013/0229875 A1 | 9/2013 | La Rosa et al. |
| 2014/0036591 A1 | 2/2014 | Takeshita |
| 2014/0063957 A1 | 3/2014 | Pan et al. |
| 2014/0198583 A1* | 7/2014 | Kern ..................... G11C 16/10 365/185.33 |
| 2015/0063038 A1 | 3/2015 | Lin et al. |
| 2015/0348640 A1 | 12/2015 | La Rosa et al. |
| 2015/0348981 A1 | 12/2015 | La Rosa et al. |

* cited by examiner

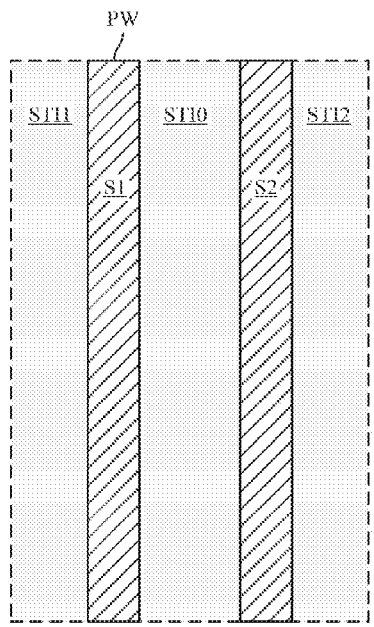
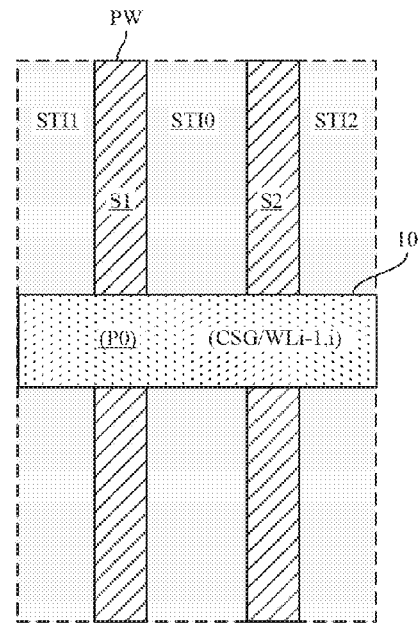
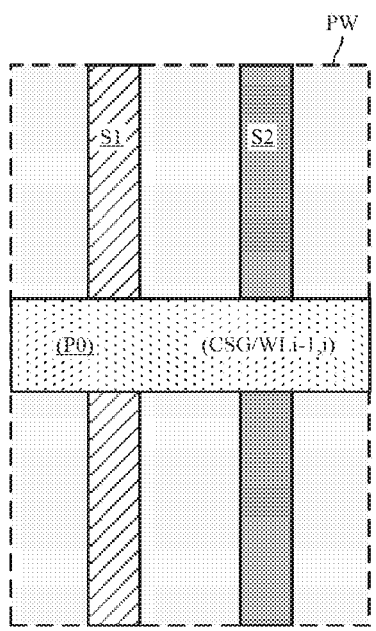
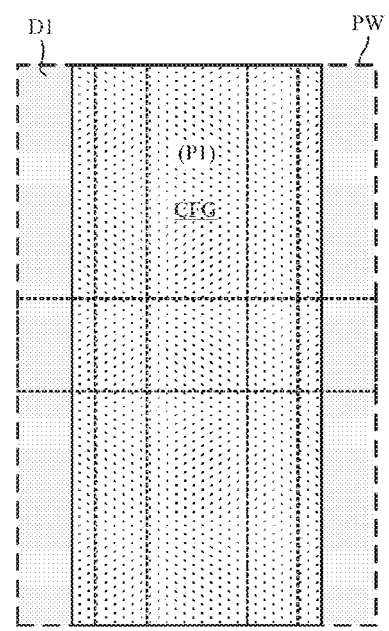
Fig. 15
Fig. 16
Fig. 17
Fig. 18

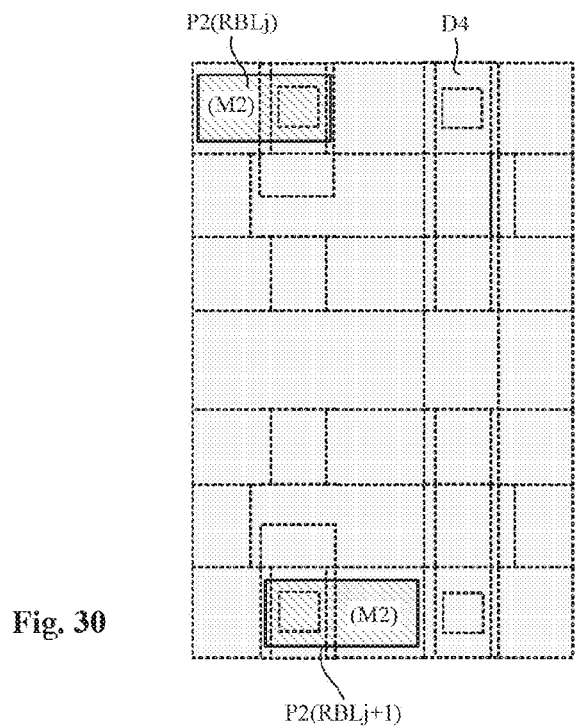
Fig. 30
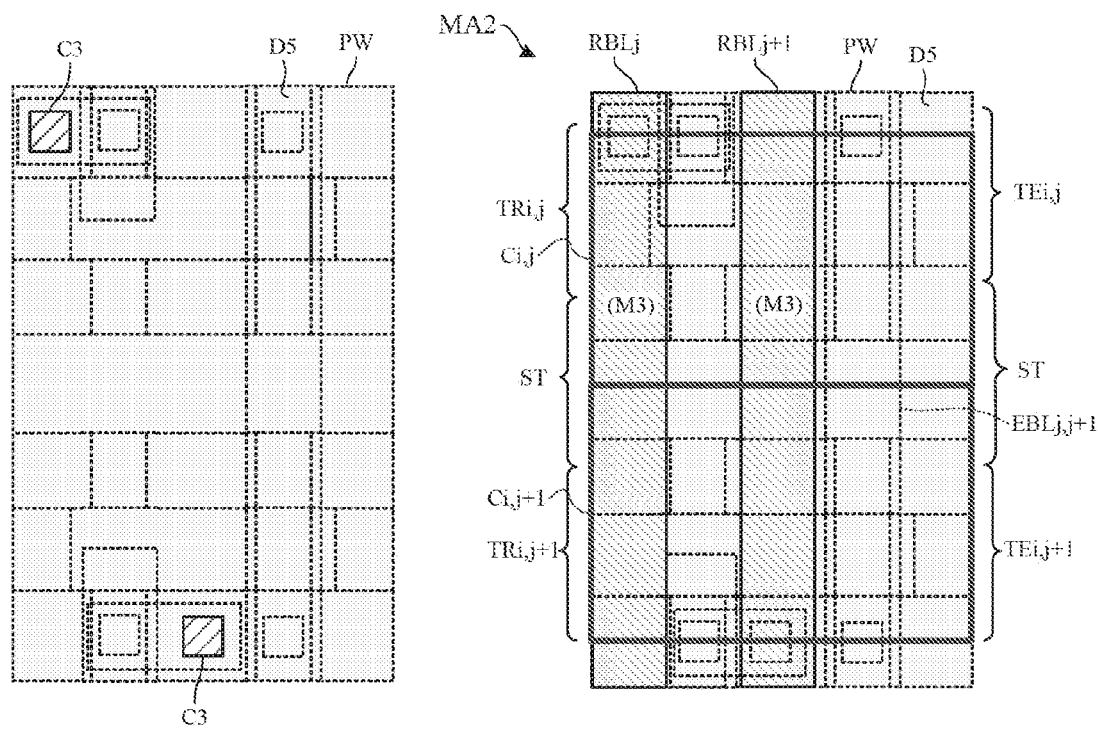
Fig. 31
Fig. 32

DUAL NON-VOLATILE MEMORY CELL COMPRISING AN ERASE TRANSISTOR

BACKGROUND

Technical Field

The present disclosure relates to non-volatile memories and in particular to a memory array and memory cell structure of the type described in the US application 2013/0228846, which is hereby incorporated by reference in its entirety.

Description of the Related Art

As a reminder, FIG. 1 represents such a memory array structure MA0 and shows memory cells $M_{i,j}$, $M_{i-1,j}$, $M_{i,j-1}$, $M_{i-1,j+1}$ of the above-mentioned type, belonging here to two adjacent physical pages $P_i$, $P_{i-1}$ of the memory array, of respective ranks "i" and "i-1". The memory cells $M_{i,j}$, $M_{i-1,j}$, $M_{i,j+1}$, $M_{i-1,j+1}$ are read- and write-accessible through bit lines $BL_j$, $BL_{j+1}$, a word line $WL_{i-1,i}$ and control gate lines $CGL_i$, $CGL_{i-1}$. Each memory cell comprises a floating-gate transistor, respectively $T_{i,j}$, $T_{i-1,j}$, $T_{i,j+1}$, $T_{i-1,j+1}$. The drain terminals D of the transistors $T_{i,j}$, $T_{i-1,j}$ are connected to the bit line $BL_j$ and the drain terminals of the transistors $T_{i,j+1}$, $T_{i-1,j+1}$ are connected to the bit line $BL_{j+1}$. The control gates CG of the transistors $T_{i,j}$, $T_{i,j+1}$ are connected to the control gate line $CGL_i$ and the control gates CG of the floating-gate transistors $T_{i-1,j}$, $T_{i-1,j+1}$ are connected to the control gate line $CGL_{i-1}$.

Furthermore, each floating-gate transistor $T_{i,j}$, $T_{i-1,j}$, $T_{i,j+1}$, $T_{i-1,j+1}$ has its source terminal coupled to a source line SL through a select transistor ST. The select transistors ST of the memory cells $M_{i,j}$ and $M_{i-1,j}$ share the same control gate CSG and the two memory cells are thus referred to as "twins". Similarly, memory cells $M_{i,j+1}$ and $M_{i-1,j+1}$ are twin memory cells and their select transistors ST have a common control gate CSG. Each common control gate is preferentially a vertical gate embedded in a substrate receiving the memory array MA0, the source line SL also being an embedded line. These common control gates CSG, or twin memory cell select gates, are connected to the word line $WL_{i-1,i}$.

Such memory cells are channel-erased or programmed, i.e., by putting the substrate to a positive erase voltage or negative programming voltage causing electric charges to be extracted from their floating gates or electric charges to be injected into their floating gates, by Fowler Nordheim effect.

More particularly, a memory cell is erased by combining the positive voltage applied to the substrate with a negative voltage applied to the control gate of its floating-gate transistor, while the control gate of the floating-gate transistor of the twin memory cell receives a positive erase-inhibit voltage preventing it from being simultaneously erased (FIG. 11 of the above-mentioned application).

Similarly, a memory cell is programmed by combining a negative voltage applied to the bit line of the memory cell and to the substrate, with a positive voltage applied to the control gate of its floating-gate transistor, while the control gate of the floating-gate transistor of the twin memory cell receives a negative program-inhibit voltage preventing it from being simultaneously programmed (FIG. 12 of the above-mentioned application).

Finally, a memory cell is read by applying a positive voltage to the control gate of its floating-gate transistor, as well as a positive voltage to the corresponding bit line, while the twin memory cell, which is connected to the same bit line, receives on its control gate a negative read-inhibit voltage preventing it from being simultaneously read (FIG. 9 of the above-mentioned application).

This memory array structure having twin memory cells comprising a shared vertical select gate embedded in the substrate, offers the advantage of having a small footprint. The channel erase method used with this memory array structure is well suited to the production of a page-erasable memory array but less so to the production of a word-erasable memory array. This emerges by comparing the word-erasable memory array represented in FIG. 24 of the above-mentioned application, with the page-erasable memory array represented in FIG. 23 of this application, the former being more complex than the latter. Therefore, for the memory array to be word-erasable, each control gate line CGL, instead of being connected to all the memory cells of a page, must be divided into a plurality of control gate lines with one control gate line per word. This causes a noticeable complexification of the word line and column decoders, and requires providing various voltage switches to control, within each page, the control gate lines of the different words.

It can thus be desired to provide an improvement of this memory array and memory cell structure that is more appropriate for the implementation of a word-erasable memory, and does not complexify the control units of the memory array.

This conventional memory array and memory cell structure also employ a word line decoder capable of applying a positive read voltage to a memory cell that must be read, while applying a negative read-inhibit voltage to its twin memory cell, as explained above.

It can thus also be desired to provide another improvement of this memory array and memory cell structure that enables a memory cell to be read without applying any negative voltage to the twin memory cell.

BRIEF SUMMARY

Some embodiments of the present disclosure relate to a non-volatile memory cell on a semiconductor substrate, comprising a first floating-gate transistor comprising a control gate, a floating gate and a drain region, a second floating-gate transistor comprising a control gate, a floating gate and a drain region, wherein the floating gates of the first and second floating-gate transistors are electrically coupled, and the second floating-gate transistor comprises a conducting region electrically coupled to its drain region and extending opposite its floating gate through a tunnel dielectric layer.

According to one embodiment, the floating gates of the first and second floating-gate transistors are formed by a same layer of a conducting material.

According to one embodiment, the conducting region is a doped region of the substrate.

According to one embodiment, the memory cell comprises at least one select transistor coupling a source region of the first floating-gate transistor to a source line.

According to one embodiment, the select transistor comprises a vertical control gate embedded in the substrate.

Some embodiments of the present disclosure also relate to a non-volatile memory on a semiconductor substrate, comprising at least one memory cell according to the present disclosure, a first bit line electrically coupled to the drain region of the first floating-gate transistor, and a second bit line electrically coupled to the drain region of the second floating-gate transistor.

According to one embodiment, the memory comprises an erasing circuit that erases the memory cell by Fowler Nordheim effect, configured for extracting negative electric charges from the floating gate of the second floating-gate transistor through the conducting region.

According to one embodiment, the memory comprises a programming circuit that programs the memory cell by Fowler Nordheim effect, configured for injecting negative electric charges into the floating gate of the second floating-gate transistor through the conducting region.

According to one embodiment, the memory comprises programming circuit that programs the memory cell by hot-electron injection, configured for injecting negative electric charges into the floating gate of the first floating-gate transistor by means of a current circulating in the transistor.

According to one embodiment, the memory comprises a reading circuit that reads the memory cell through the first floating-gate transistor.

According to one embodiment, the memory comprises a first memory cell according to the present disclosure and a second memory cell of the same structure as the first memory cell, having a select transistor having the same control gate as the select transistor of the first memory cell.

According to one embodiment, the memory comprises a bit line electrically coupled to the drain region of the first floating-gate transistor of the first memory cell, another bit line electrically coupled to the drain region of the first floating-gate transistor of the second memory cell, and yet another bit line, electrically coupled both to the drain region of the second floating-gate transistor of the first memory cell and to the drain region of the second floating-gate transistor of the second memory cell.

Some embodiments of the present disclosure also relate to a method for manufacturing on a semiconductor substrate a memory cell according to the present disclosure, comprising the steps of forming in the substrate isolating trenches delimiting at least a first and a second strip of substrate, doping the second strip of substrate to render it conducting, forming on the substrate a floating gate arranged transversally to the two strips of substrate, with interposition of a first dielectric layer, forming a control gate on the floating gate with interposition of a second dielectric layer, to obtain a gate stack, and doping the two strips of substrate on either side of the gate stack, to generate drain and source regions of the first floating-gate transistor and at least one drain region of the second floating-gate transistor, the conducting region opposite the floating gate of the second floating-gate transistor being formed by a region of the second strip of substrate doped before forming the gate stack.

According to one embodiment, the method comprises a step of forming in the substrate a conducting trench arranged transversally to the strips of substrate and forming, after doping the two strips of substrate, an embedded vertical gate of a select transistor of the memory cell.

Some embodiments of the present disclosure also relate to a method for erasing a non-volatile memory cell on a semiconductor substrate, the memory cell comprising a first floating-gate transistor comprising a control gate, a floating gate, a tunnel dielectric layer between the floating gate and the substrate, a drain region and a source region, the method comprising the steps of: providing a second floating-gate transistor comprising a control gate, a floating gate and a drain region, coupling the floating gates of the first and second floating-gate transistors, providing in the second floating-gate transistor a conducting region electrically coupled to its drain region and extending opposite its floating gate through a tunnel dielectric layer, and applying a negative electric potential difference between the control gate and the drain region of the second floating-gate transistor, so as to extract negative electric charges from the floating gate of the second floating-gate transistor through the conducting region.

According to one embodiment, the method comprises the steps of providing a first bit line electrically coupled to the drain region of the first floating-gate transistor, providing a second bit line electrically coupled to the drain region of the second floating-gate transistor, providing a control gate line electrically coupled to the control gates of the first and second floating-gate transistors, and applying the negative electric potential difference between the control gate and the drain region of the second floating-gate transistor through the control gate line and the second bit line.

BRIEF DESCRIPTION OF THE SEVERAL VIEWS OF THE DRAWINGS

Some embodiments of and methods for manufacturing a memory array and memory cell structure according to the present disclosure, and methods for reading and writing memory cells according to the present disclosure, will be described below in relation with, but not limited to, the accompanying figures, in which:

FIGS. 15 to 24 show steps of a method for manufacturing a memory cell shown on FIGS. 2 to 4, FIGS. 28 to 32 show steps of a method for manufacturing a memory cell shown on FIG. 27.

DETAILED DESCRIPTION

Figure 1:
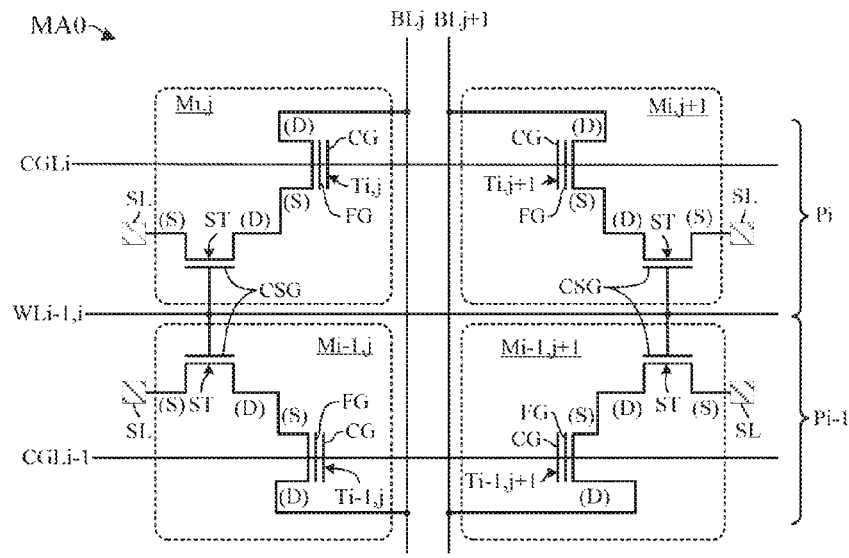
FIG. 1 described above is the wiring diagram of a conventional memory array and memory cell structure.
Figure 2:
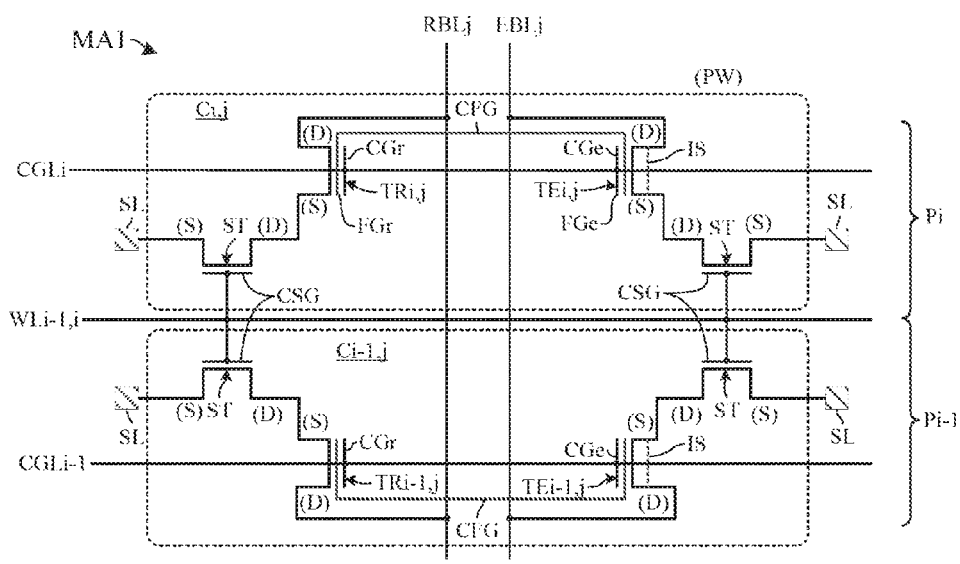
FIG. 2 is the wiring diagram of a first embodiment of a memory array and memory cell structure according to a first improvement according to the present disclosure.

FIG. 2 is the wiring diagram of one embodiment of two memory cells $C_{i,j}$, $C_{i-1,j}$ and of a memory array MA1 according to a first improvement according to the present disclosure of the memory array and memory cell structure in FIG. 1.

The memory cells are read- and write-accessible via a first bit line $RBL_j$, a second bit line $EBL_j$, a word line $WL_{i-1,i}$, and two control gate lines $CGL_i$, $CGL_{i-1}$. The memory cell $C_{i,j}$ belongs to a physical page $P_i$ of the memory array and the memory cell $C_{i-1,j}$ belongs to an adjacent page $P_{i-1}$. The pages $P_i$, $P_{i-1}$ may comprise various other memory cells and the memory array MA1 may comprise various other pages.

The memory cell $C_{i,j}$ comprises two floating-gate transistors $TR_{i,j}$, $TE_{i,j}$ the floating gates FGr, FGe of which are interconnected, the floating-gate transistor $TR_{i,j}$ being dedicated to reading the transistor memory cell and the floating-gate transistor $TE_{i,j}$ being dedicated to erasing the memory cell. According to one embodiment, the floating gates FGr, FGe are interconnected by manufacturing the two floating gates from a same conducting element CFG.

The transistor $TR_{i,j}$ has a control gate CGr connected to the control gate line $CGL_i$, a drain terminal D connected to the bit line $RBL_j$ and a source terminal S connected to the drain terminal D of a select transistor ST the source terminal S of which is coupled to a source line SL. The transistor $TE_{i,j}$ has a control gate CGe connected to the control gate line $CGL_i$, a drain terminal D connected to the bit line $EBL_j$ and a source terminal S connected to the drain terminal D of a select transistor ST the source terminal S of which is coupled to a source line SL.

The memory cell $C_{i-1,j}$ has the same structure as the memory cell $C_{i,j}$ and comprises two floating-gate transistors $TR_{i-1,j}$, $TE_{i-1,j}$ the floating gates FGr, FGe of which are interconnected and/or formed by a same conducting element CFG. The transistor $TR_{i-1,j}$ has a control gate CGr connected to the control gate line $CGL_{i-1}$, a drain terminal D connected to the bit line $RBL_j$ and a source terminal S connected to the drain terminal D of a select transistor ST the source terminal S of which is coupled to a source line SL. The floating-gate transistor $TE_{i-1,j}$ has a control gate CGe connected to the control gate line $CGL_{i-1}$, a drain terminal D connected to the bit line $EBL_j$ and a source terminal S connected to the drain terminal D of a select transistor ST the source terminal S of which is coupled to a source line SL.

The select transistors ST associated with the floating-gate transistors $TR_{i,j}$, $TR_{i-1,j}$ have a common control gate CSG connected to the word line $WL_{i-1,i}$, that is preferentially produced in the form of a vertical gate embedded in a substrate receiving the memory array MA0. Similarly, the select transistors ST associated with the floating-gate transistors $TE_{i,j}$, $TE_{i-1,j}$ have a common embedded vertical control gate CSG that is connected to the word line $WL_{i-1,i}$. The memory cell $C_{i,j}$ is thus, structurally, the equivalent of the combination of the memory cells $M_{i,j}$, $M_{i,j+1}$ shown on FIG. 1, the floating gates of which have been electrically coupled. Similarly, the memory cell $C_{i-1,j}$ is, structurally, the equivalent of the combination of the memory cells $M_{i-1,j}$, $M_{i-1,j+1}$ shown on FIG. 1 the floating gates of which have been electrically coupled. The two memory cells may thus be referred to as "dual" memory cells. As their select transistors ST have the same control gate in pairs, these memory cells may also be referred to as "twin" memory cells.

However, the floating-gate transistor $TE_{i,j}$ differs from the floating-gate transistor $T_{i,j+1}$ of the memory cell $M_{i,j+1}$ in that it comprises a conducting region IS that extends opposite its floating gate FGe with interposition of a tunnel dielectric layer, and which is electrically coupled to its drain terminal D. Similarly, the floating-gate transistor $TE_{i-1,j}$ differs from the floating-gate transistor $T_{i-1,j+1}$ of the memory cell $M_{i-1,j+1}$ in that it comprises a conducting region IS that extends opposite its floating gate FGe through a tunnel dielectric layer, and which is electrically coupled to its drain terminal D.

Figure 3:
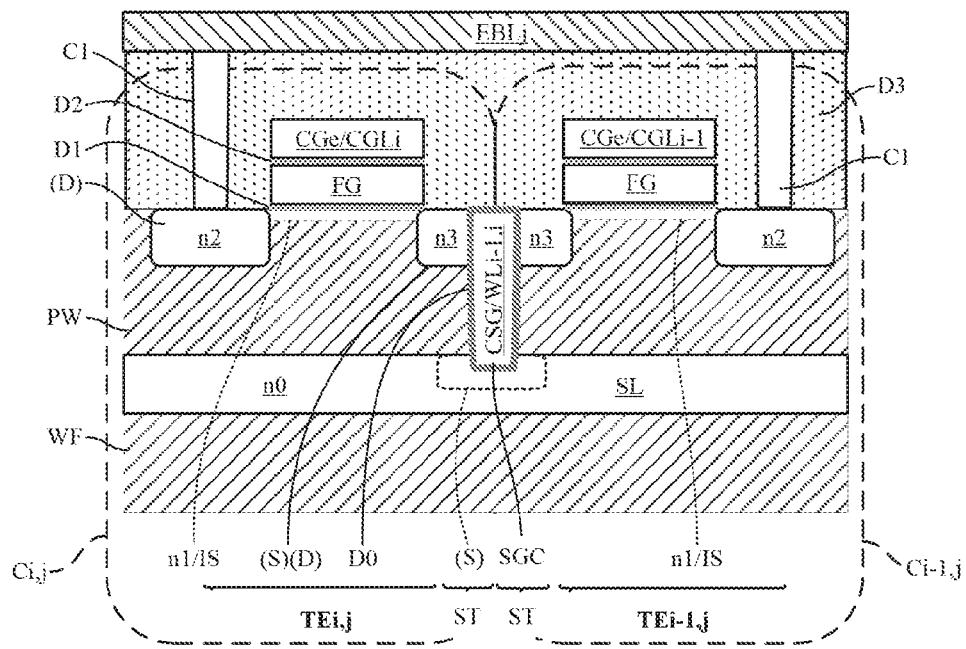
FIG. 3 is a cross-section of a memory cell in FIG. 2.

FIG. 3 is a cross-section of one embodiment of the transistors $TE_{i,j}$, $TE_{i-1,j}$ and of their respective select transistors ST. The floating-gate transistors are produced on a substrate PW, for example made of silicon, forming the upper region of a semiconductor chip WF. The chip WF is initially a wafer on which several integrated circuits are produced, which is then cut into individual chips.

The source lines SL of the select transistors ST are formed by a deep doped region n0 that here forms a collective source plane for the entire memory array. The common control gate CSG of the select transistors ST is formed with a conducting material, for example polysilicon (polycrystalline silicon), deposited in a trench made in the substrate, and isolated from the latter by a dielectric layer D0. This "conducting trench" also forms the word line $WL_{i-1,i}$ according to an axis perpendicular to the plane of the figure.

The floating gates FGe of the transistors $TE_{i,j}$, $TE_{i-1,j}$ are arranged on either side of the trench CSG, and are supported by the substrate PW through a tunnel dielectric layer D1. They are formed here by a conducting part, for example made of polysilicon, which extends up to the transistors $TR_{i,j}$, $TR_{i-1,j}$ (not shown in this section plane, cf. FIG. 4) to also form the floating gates of these transistors.

The control gates CGe of the transistors $TE_{i,j}$, $TE_{i-1,j}$ extend above the floating gates through a dielectric layer D2. They are formed here by conducting strips of polysilicon that also form the control gate lines $CGL_i$, $CGL_{i-1}$ according to an axis perpendicular to the plane of the figure.

Doped regions n2 and n3 implanted on either side of the gate stack FG/CGe respectively form the drain (D) and source (S) regions of the transistors $TE_{i,j}$, $TE_{i-1,j}$, the regions n3 also forming the drain regions (D) of the select transistors ST. The source regions (S) of the select transistors ST are here formed by the layer n0, the common vertical gate CSG of the select transistors extending here up to the region n0. In one alternative embodiment, the lower end of the conducting trench CSG does not reach the region n0 and a deep doped pocket is implanted between the trench and the layer n0 to form the source region of the select transistors ST.

The gate stacks FG/CGe of the transistors $TE_{i,j}$, $TE_{i-1,j}$ are covered with a dielectric layer D3 over which the bit line $EBL_j$ extends. Contacts C1 pass through the layer D3 to electrically couple the bit line $EBL_j$ to the drain regions n2 (D) of the transistors $TE_{i,j}$, $TE_{i-1,j}$. The conducting regions IS of the transistors $TE_{i,j}$, $TE_{i-1,j}$ are here doped regions n1 of the substrate which extend beneath the floating gates FG, between the drain n2 and source n3 regions of the transistors $TE_{i,j}$, $TE_{i-1,j}$, and are thus covered with the tunnel dielectric layer D1. The dielectric layers D0, D1, D2 and D3 are for example made of silicon dioxide $SiO2$.

Figure 4:
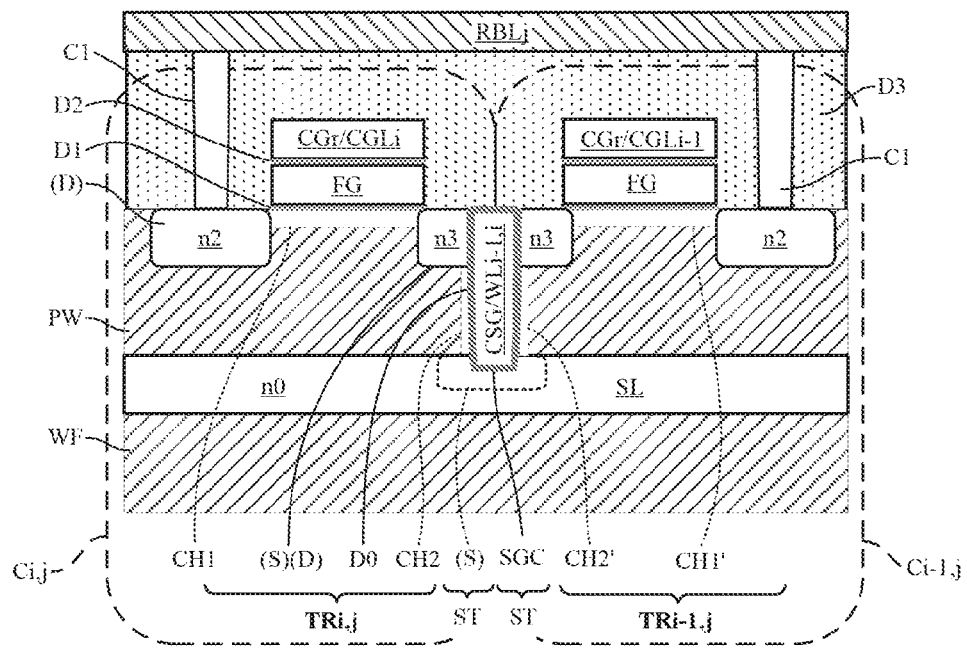
FIG. 4 is another cross-section of the memory cell.

FIG. 4 is a cross-section of the floating-gate transistors $TR_{i,j}$, $TR_{i-1,j}$ of the memory cells $C_{i,j}$, $C_{i-1,j}$ and of their respective select transistors ST. The structure of these transistors is substantially identical to that of the transistors $TE_{i,j}$, $TE_{i-1,j}$ and will not be described again. The control gates CGe of these transistors are formed by the polysilicon parts forming the control gate lines $CGL_i$, $CGL_{i-1}$, and their floating gates FG are formed by the same polysilicon parts as those which form the floating gates of the transistors $TE_{i,j}$, $TE_{i-1,j}$ (FIG. 3). Their drain regions n2 (D) are coupled by contacts C1 to the bit line $RBL_j$ which extends over the dielectric layer D3.

The transistors $TR_{i,j}$, $TR_{i-1,j}$ differ from the transistors $TE_{i,j}$, $TE_{i-1,j}$ in that they do not have the conducting region IS extending beneath the floating gate FG. Thus, when these transistors are biased by an appropriate gate voltage, a conducting channel CH1 or CH1' can form between the drain region n2 (D) and the source region n3 (S). A vertical conducting channel CH2 or CH2' can also form between the drain n3 (D) and source (S) regions of the select transistor ST if the common vertical gate CSG of these transistors simultaneously receives a bias voltage. More particularly, the vertical channel region CH2 of the select transistor ST of the memory cell $C_{i,j}$ extends opposite a first face of the embedded vertical control gate CSG, and the vertical channel region CH2' of the select transistor ST of the memory cell $C_{i-1,j}$ extends opposite a second face of the embedded vertical control gate, and thus opposite the channel region CH2 of the select transistor of the memory cell $C_{i,j}$.

The transistors $TR_{i,j}$, $TR_{i-1,j}$ may also differ from the transistors $TE_{i,j}$, $TE_{i-1,j}$ by the thickness of their tunnel dielectric layer D1, which can be different from the one that extends beneath the floating gates of the transistors $TE_{i,j}$, $TE_{i-1,j}$, this choice being offered to those skilled in the art depending on the method for programming the memory cells selected, i.e., by Fowler Nordheim effect by means of the transistors $TE_{i,j}$, $TE_{i-1,j}$ or by hot-electron injection by means of the transistors these two options being described below.

Unlike the transistors $TR_{i,j}$, $TR_{i-1,j}$, the transistors $TE_{i,j}$, $TE_{i-1,j}$ cannot have any conducting channel CH1 controlled by the voltage applied to them, due to the fact that the region extending between their drain n2 and source n3 regions is short-circuited by the doped region n1 (FIG. 3). These transistors are thus always on whatever their gate voltage, and cannot be used to read the memory cells $C_{i,j}$, $C_{i<1,j}$. However, they can be used to erase the memory cells in conditions where no drain-source current passes through them, i.e., by Fowler Nordheim effect. They may also be used to program the memory cells in conditions where no drain-source current passes through them, i.e., also by Fowler Nordheim effect, as we will see it below.

As a result, the select transistors ST associated with the transistors $TE_{i,j}$, $TE_{i-1,j}$ are not used and are present here only to streamline the manufacturing of the memory cells, in accordance with one embodiment of a manufacturing method described below. It may indeed be simpler to produce a useless transistor within a set of transistors used, when the non-production of the useless transistor would involve additional masking and photolithography steps. As, firstly, these select transistors are on when the word line to which they are connected receives a positive voltage, and as, secondly, the floating-gate transistors $TE_{i,j}$, $TE_{i-1,j}$ are always on due to their region IS, one should ensure that the corresponding bit line $EBL_j$ cannot simultaneously receive a voltage different from zero.

In short, the transistor $TE_{i,j}$ can be used as transistor for erasing the memory cell $C_{i,j}$ by Fowler Nordheim effect, which involves a static programming without any programming current, whereas the transistor $TR_{i,j}$ can be used as transistor for reading the memory cell. Similarly, the transistor $TE_{i-1,j}$ can be used as transistor for erasing the memory cell $C_{1-1,j}$ by Fowler Nordheim effect and the transistor $TR_{i-1,j}$ can be used as transistor for reading the memory cell. The bit line $RBL_j$ can be used as bit line for reading and the bit line $EBL_j$ as bit line for erasing the memory cell $C_{i,j}$ or the memory cell $C_{i-1,j}$.

As regards the programming of the memory cells $C_{i,j}$, $C_{i-1,j}$, some embodiments of the present disclosure provide two methods, between which those skilled in the art may choose, i.e., a programming method by Fowler Nordheim effect by means of the erase transistor $TE_{i,j}$ or $TE_{i-1,j}$, or a programming method by hot-electron injection by means of the read transistor $TR_{i,j}$, $TR_{i-1,j}$.

Methods for erasing, programming and reading cells of the memory array MA1 will be described below, assuming as an example that it is desirable to erase, program and read the memory cell $C_{i,j}$.

Erasing of a Memory Cell by Fowler Nordheim Effect via the Eerase Transistor $TE_{i,j}$ A method for erasing the memory cell $C_{i,j}$ without erasing the memory cell $C_{i-1,j}$, via the erase transistor $TE_{i,j}$, is described in Table 1 in the Annex, which is an integral part of the description.

Figure 5:
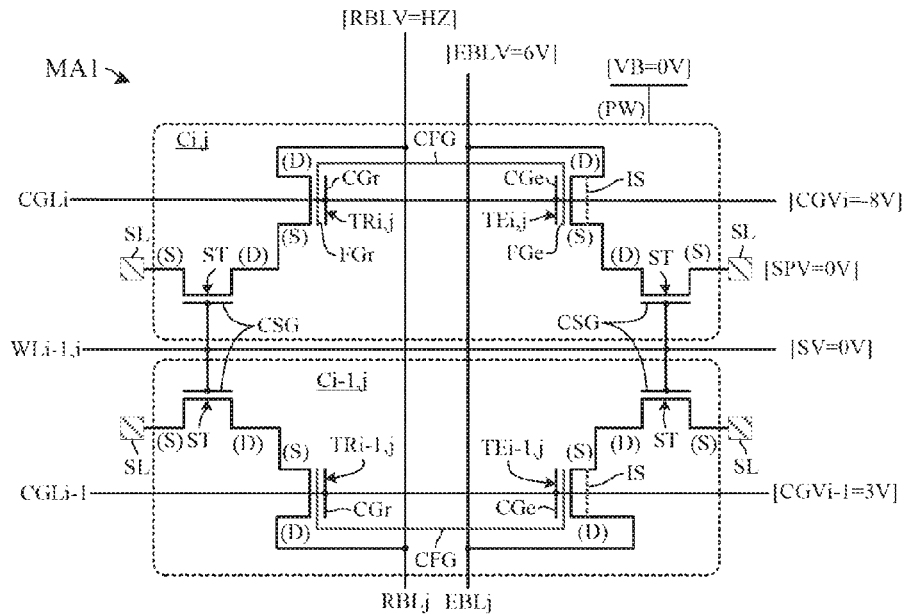
FIG. 5 shows voltages applied to the memory array in FIG. 2 to erase a memory cell.
Figure 6:
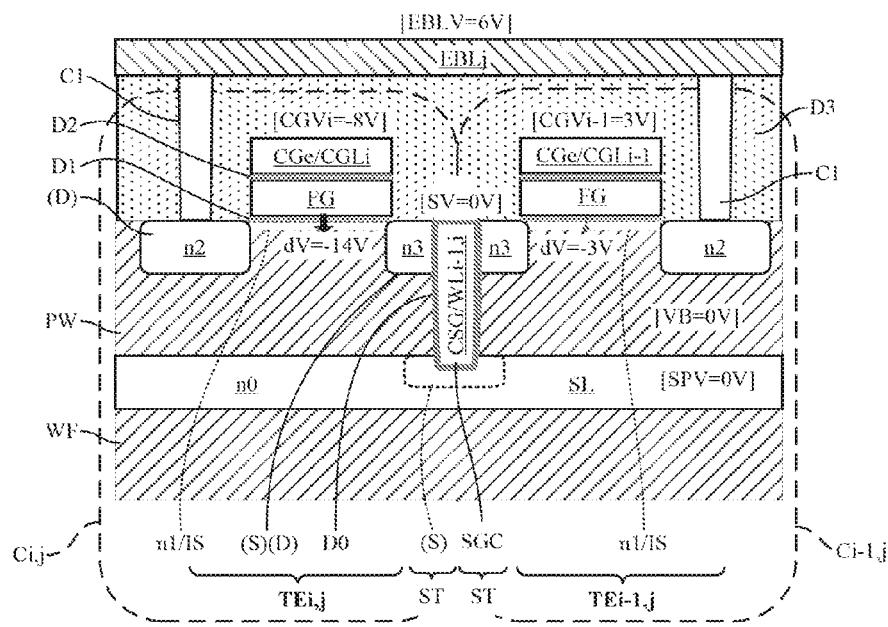
FIG. 6 is a cross-section of a memory cell in FIG. 5, and shows voltages applied to the memory cell.

FIGS. 5 and 6 show this erasing method. FIG. 5 is the wiring diagram in FIG. 2 in which the voltage values contained in Table 1 have been entered. FIG. 6 is a cross-section of the transistors $TE_{i,j}$, $TE_{i-1,j}$. identical to that of FIG. 3, in which the voltage values contained in Table 1 have been entered.

The conducting region IS of the transistor $TE_{i,j}$ is taken to the positive voltage EBLV applied to the bit line $EBL_j$, here 6V, through the contact C1 and the drain region n1 (D) of the transistor. As the control gate CGe of the transistor $TE_{i,j}$ is taken to the negative voltage $CGV_i$, here −8V, a voltage difference dV equal to −14V (FIG. 6) appears between this control gate and the conducting region IS which causes electrons to be extracted from the floating gate FGe by Fowler Nordheim effect, which puts the transistor $TE_{i,j}$ to the erased state. As the bit line $RBL_j$ connected to the floating-gate transistor $TR_{i,j}$ is at high impedance, this transistor does not play any role in the process of erasing the memory cell. As the floating gate of the transistor $TR_{i,j}$ is however electrically coupled to that of the transistor $TE_{i,j}$, the transfer of electric charges also causes the erasing of the transistor $TR_{i,j}$, the entire memory cell $C_{i,j}$ being thus erased through the transistor $TE_{i,j}$.

The conducting region IS of the transistor $TE_{i-1,j}$ of the twin memory cell $C_{i-1,j}$ is also taken to the positive voltage EBLV applied to the bit line $EBL_j$, here 6V, through the contact C1 and the drain region n1 (D) of the transistor. As the control gate CGe of the transistor $TE_{i-1,j}$, is taken to the positive voltage $CGV_{i-1}$, here 3V, a voltage difference dV equal to −3V appears between this control gate and the conducting region IS, which is insufficient to extract electrons from the floating gate of the transistor. The twin memory cell $C_{i-1,j}$, is thus not erased.

This memory array and memory cell structure thus enables individual erasing of each memory cell, i.e., erasing by bit. This possibility allows a memory erasable by bit, by word or by page to be produced indifferently without changing the general structure of the memory array or of its control units.

Figure 7:
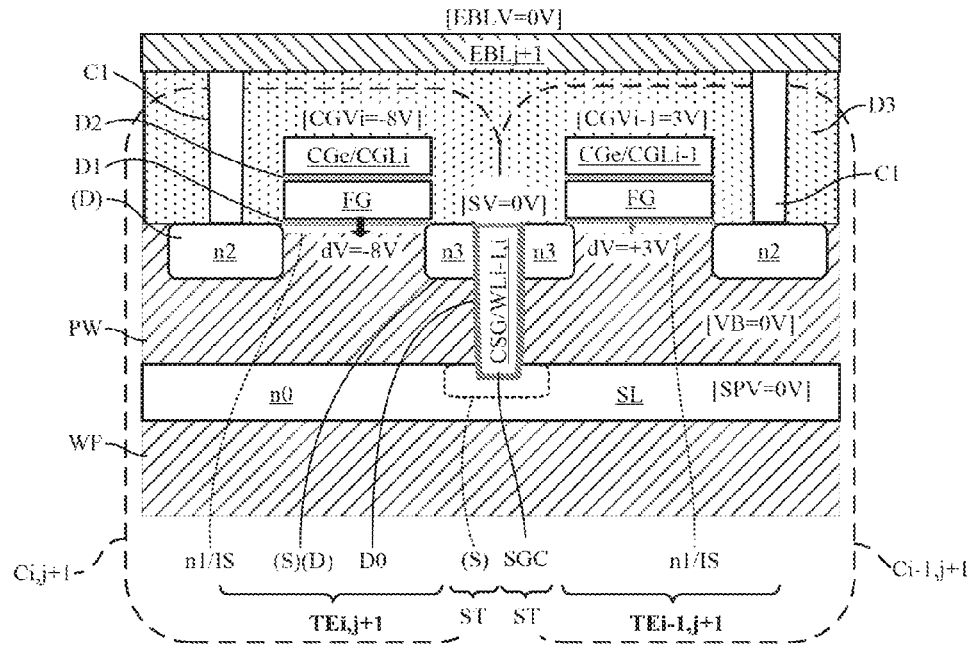
FIG. 7 is another cross-section of the memory cell, and shows the voltages applied to the memory cell.

FIG. 7 is a cross-section of two transistors $TE_{i,j+i}$, $TE_{i-1,j-1}$ of two memory cells $C_{i,j+1}$, $C_{i-1,j+1}$ (not represented on FIG. 2 or 5) that are contiguous to the memory cells $C_{i,j}$, $C_{i-1,j}$. The memory cells $C_{i,j+1}$, $C_{i-1,j+1}$ are connected to the same word line $WL_{i-1,i}$ as the memory cells $C_{i,j}$, $C_{i-1,j}$ but are connected to a different bit line $EBL_{j+1}$ that receives the default voltage EBLV*, here 0V. The transistors $TE_{i,j-1}$, $TE_{i-1,j+1}$ have their control gates CGe connected to the same control gate lines $CGL_i$, $CGL_{i-1}$ as the transistors $TE_{i,j}$, $TE_{1-1,j}$ and thus receive the same voltages $CGV_i$, here −8V, and $CGV_{1-1,1}$, here 3V. Thus, the voltage difference dV between the control gate CGe of the transistor $TE_{i,j+1}$ and its conducting region IS is equal to −8V and this transistor undergoes an erasing stress, i.e., a low-intensity spurious erasing that could, if the transistor were in the programmed state, and after many cycles of erasing other memory cells connected to the control gate lines $CGL_i$, $CGL_{i-1}$, substantially alter its threshold voltage and thus cause a corruption of its state, and thus a corruption of the data bit associated with the programmed state.

Furthermore, the voltage difference dV between the control gate CGe of the transistor $TE_{i-1,j+1}$ and its conducting region IS is 3V and this transistor does not undergo any erasing stress, the control gate line $CGL_{i-1}$ being taken to only 3V. Similarly, default voltages applied to the memory cells connected to other word lines WL (not represented on the figures) do not cause any erasing stress in these memory cells.

Finally, the erasing method according to the present disclosure enables not only each memory cell to be individually erased, but also limits the appearance of an erasing stress on the memory cells connected to the same control gate line, whereas various other known erasing methods, enabling only erasing by word, or otherwise by page, also cause an erasing stress on the memory cells connected to other word lines. The management of the erasing stress, by methods for refreshing the memory cells known per se, is thus simplified, given the smaller number of memory cells to be refreshed. It is possible, for example, to decide to initiate a sequence for refreshing the memory cells of a word line after N programming cycles of memory cells of this word line, by providing an erase cycle counter associated with the word line.

Programming of a Memory Cell by Fowler Nordheim Effect via the Erase Transistor $TE_{i,j}$ A method for programming the memory cell $C_{i,j}$ without programming the memory cell $C_{i-1,j}$, via the erase transistor $TE_{i,j}$, is described by Table 2 in the Annex.

Figure 8:
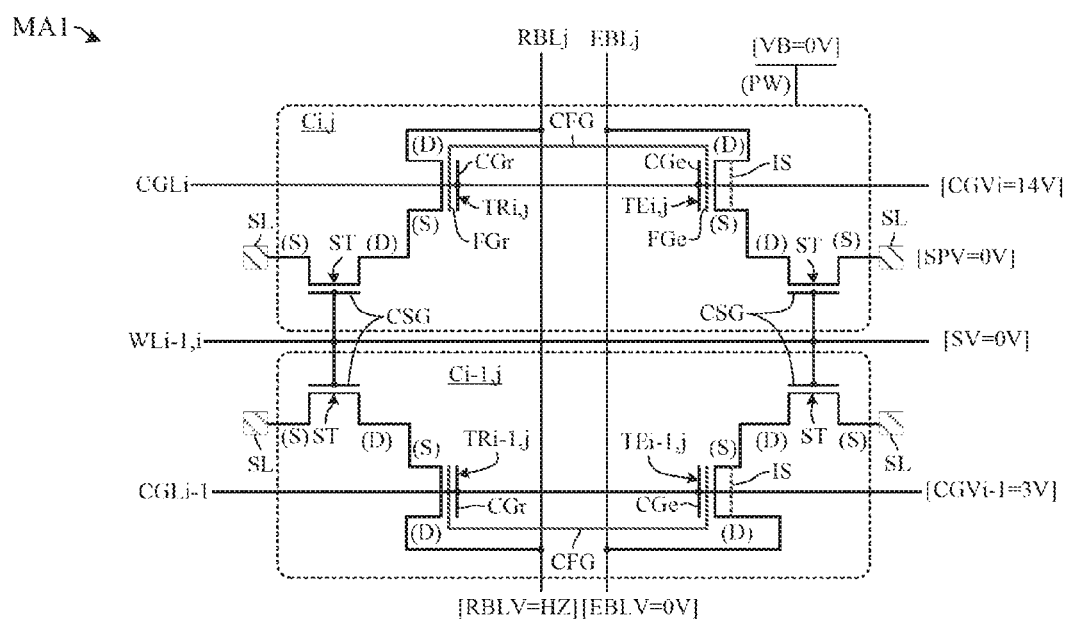
FIG. 8 shows voltages applied to the memory array in FIG. 2 to program a memory cell by Fowler Nordheim effect.
Figure 9:
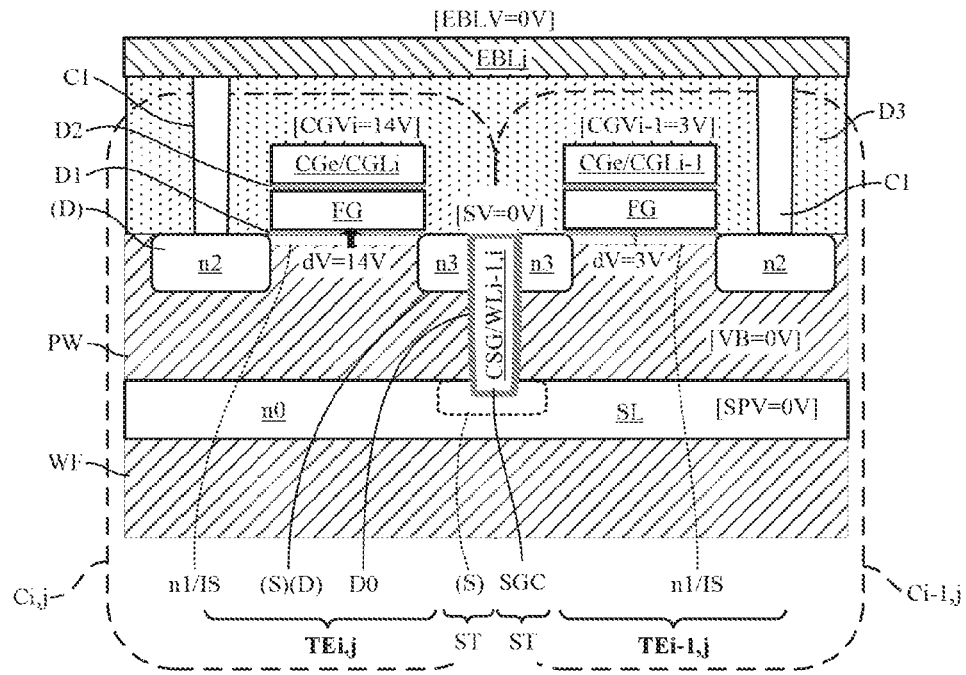
FIG. 9 is a cross-section of a memory cell in FIG. 8 and shows voltages applied to the memory cell.

FIGS. 8 and 9 show this programming method. FIG. 8 is the wiring diagram in FIG. 2 in which the voltage values contained in Table 2 have been entered. FIG. 9 is a cross-section of the transistors $TE_{i,j}$, $TE_{i-1,j}$ identical to that of FIG. 3, in which the voltage values contained in Table 2 have been entered.

The conducting region IS of the transistor $TE_{i,j}$ is taken to the voltage EBLV applied to the bit line $EBL_j$, here 0V, through the contact C1 and the drain region n1 (D) of the transistor. As the control gate CGe of the transistor $TE_{i,j}$ is taken to the positive voltage $CGV_i$ here 14V, a positive voltage difference dV equal to 14V (FIG. 9) appears between this control gate and the conducting region IS which causes electrons to be injected into the floating gate FGe by Fowler Nordheim effect, which puts the transistor $TE_{i,j}$ to the programmed state. As the bit line $RBL_j$ connected to the floating-gate transistor $TR_{i,j}$ is at high impedance, this transistor does not play any role in the process of programming the memory cell. As the floating gate of the transistor $TR_{i,j}$ is however electrically coupled to that of the transistor $TE_{i,j}$, the transfer of electric charges also causes the programming of the transistor $TR_{i,j}$, the entire memory cell $C_{i,j}$ being thus programmed through the transistor $TE_{i,j}$.

The conducting region IS of the transistor $TE_{i-1,j}$ of the twin memory cell $C_{i-1,j}$, is taken to the voltage EBLV applied to the bit line $EBL_j$, here 0V, through the contact C1 and the drain region n1 (D) of the transistor. As the control gate CGe of the transistor $TE_{i-1,j}$ is taken to the positive voltage $CGV_{i-1}$, here 3V, a voltage difference dV equal to 3V appears between this control gate and the conducting region IS, which is insufficient to inject electrons into the floating gate of the transistor. The twin memory cell is thus not programmed.

Figure 10:
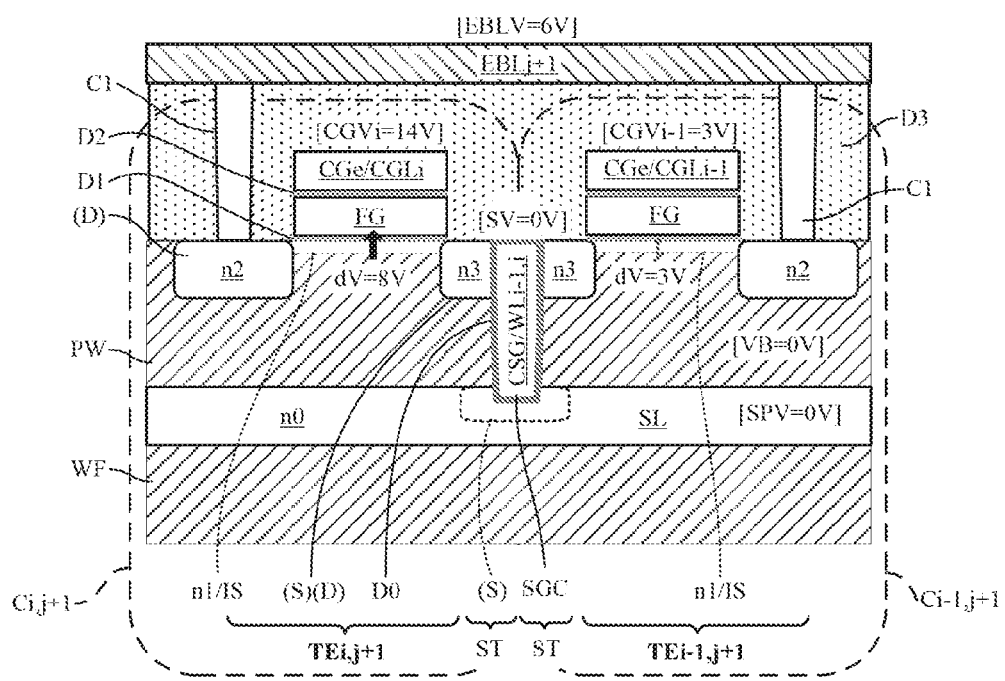
FIG. 10 is another cross-section of the memory cell and shows the voltages applied to the memory cell.

FIG. 10 is a cross-section of the transistors $TE_{i,j+1}$, $TE_{i-1,+1}$ of the neighboring memory cells $C_{i,j+1}$, $C_{i-1j-1}$ already described in connection with FIG. 7, connected to the same word line $WL_{i-1,i}$ as the memory cells $C_{i,j}$, $C_{1-1,j}$ but connected to the neighboring bit line $EBL_{j+1}$ that receives the default voltage EBLV*, here 6V. The transistors $TE_{i,j-1}$, $TE_{-i,j+i}$ have their control gates CGe connected to the same control gate lines CGL, as the transistors $TE_{i,j}$, $TE_{1-1,j}$ and thus receive the same voltages $CGV_i$, here 14V, and $CGV_{1-1}$, here 3V. Thus, the voltage difference dV between the control gate CGe of the transistor $TE_{i,j+1}$ and its conducting region IS is 8V and this transistor undergoes a programming stress, i.e., a low-intensity spurious programming.

Furthermore, the voltage difference dV between the control gate CGe of the transistor $TE_{1-1,j+1}$ and its conducting region IS is 3V and this transistor does not undergo any programming stress, the control gate line $CGL_{i-1}$ being taken to only 3V. Similarly, default voltages applied to the memory cells connected to other word lines WL (not represented on the figures) do not cause any programming stress in these memory cells.

Finally, this programming method, like the erasing method previously described, only causes an electrical stress to the memory cells connected to the same control gate line, the effects of which can be cancelled out by a refreshing method of the above-mentioned type.

Programming of a Memory Cell by Hot-Electron Injection via the Read Transistor $TR_{i,j}$ A method for programming the memory cell $C_{i,j}$ without programming the memory cell $C_{i-1,j}$, via the read transistor $TR_{i,j}$, is described by Table 3 in the Annex.

Figure 11:
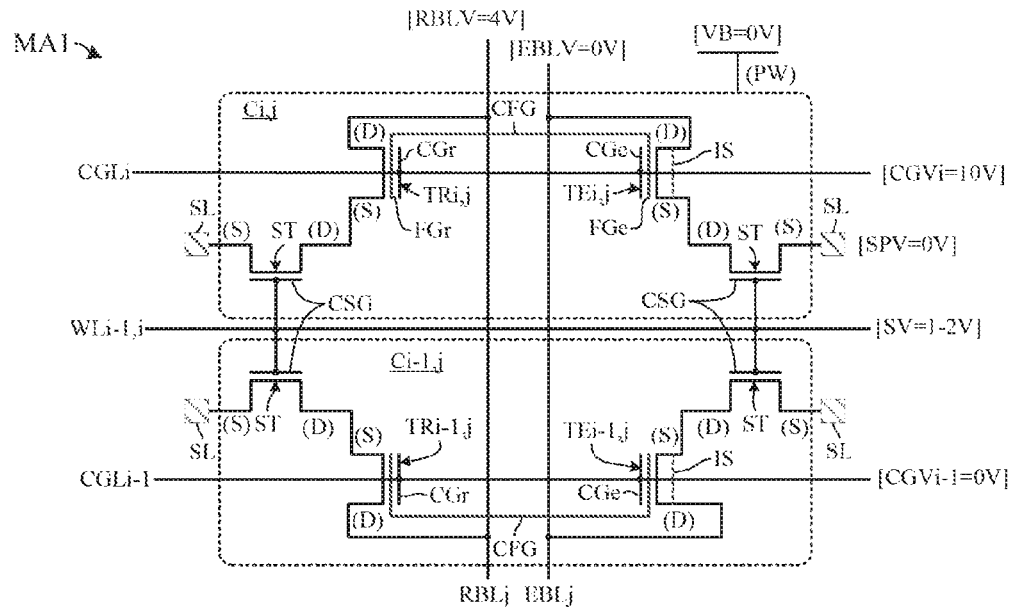
FIG. 11 shows voltages applied to the memory array in FIG. 2 to program a memory cell by hot-electron injection.
Figure 12:
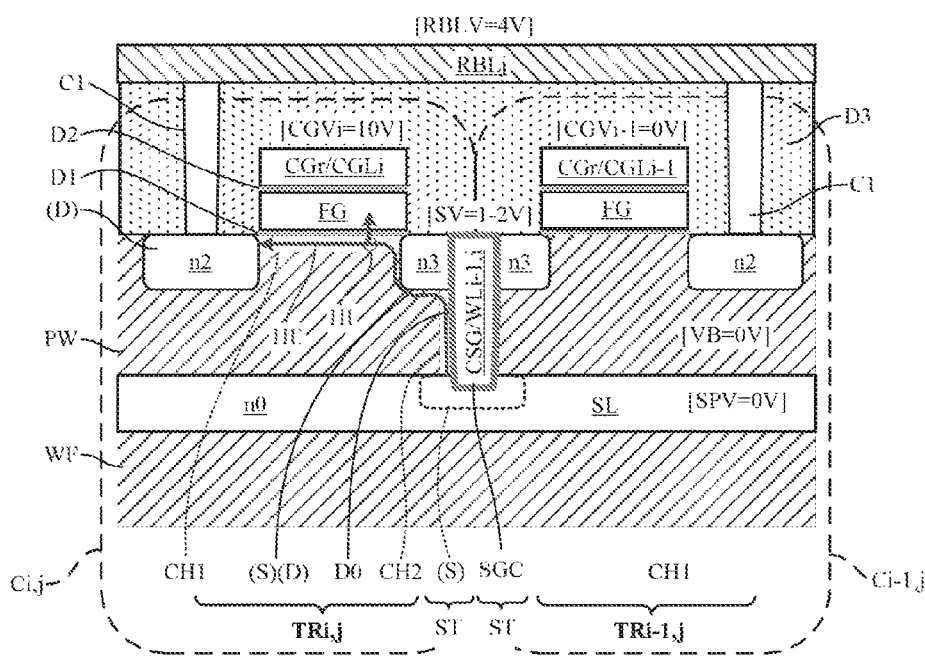
FIG. 12 is a cross-section of a memory cell in FIG. 11 and shows voltages applied to the memory cell.

FIGS. 11 and 12 show this programming method. FIG. 11 is the wiring diagram in FIG. 2 in which the voltage values contained in Table 3 have been entered. FIG. 12 is a cross-section of the transistors $TR_{i,j}$, $TR_{i-1,j}$ identical to that of FIG. 4, in which the voltage values contained in Table 3 have been entered.

The transistor $TR_{i,j}$ receives the positive voltage $CGV_i$, here 10V, on its control gate and is in the on state, the conducting channel CH1 appearing in the substrate PW beneath the gate stack FG/CGr. The select transistor ST associated with the transistor $TR_{i,j}$ receives the positive select voltage SV, here 1 to 2V, on its embedded vertical gate CSG, and is in the on state, the vertical conducting channel CH2 appearing opposite the gate CSG. As the bit line $RBL_j$ is taken to the positive voltage RBLV, here 4V, and the source line SL is coupled to the ground (0V), a current circulates from the bit line to the source line through the transistor $T_{i,j}$ and the corresponding select transistor ST. This current corresponds to a flow of electrons HE shown on FIG. 12, in the opposite direction to the current. This flow of electrons contains high kinetic energy electrons (hot electrons) that bypass the doped region n3 ("cold" region). Some of these electrons are injected into the floating gate at an injection point HI, causing the programming of the transistor $TR_{i,j}$, and the programming of the erase transistor $TE_{i,j}$ that does not play any role in the programming process here. However, the transistor $TR_{i-1,j}$ of the twin cell receives the voltage $CGV_{i-1}$ that is equal to 0V, such that it does not undergo any spurious programming process, nor any of the other read transistors of the memory array, which receive only zero voltages.

Reading of a Memory Cell via the Read Transistor $TR_{i,j}$

A method for reading the memory cell $C_{i,j}$ via the read transistor $TR_{i,j}$, is described by Table 4 in the Annex.

Figure 13:
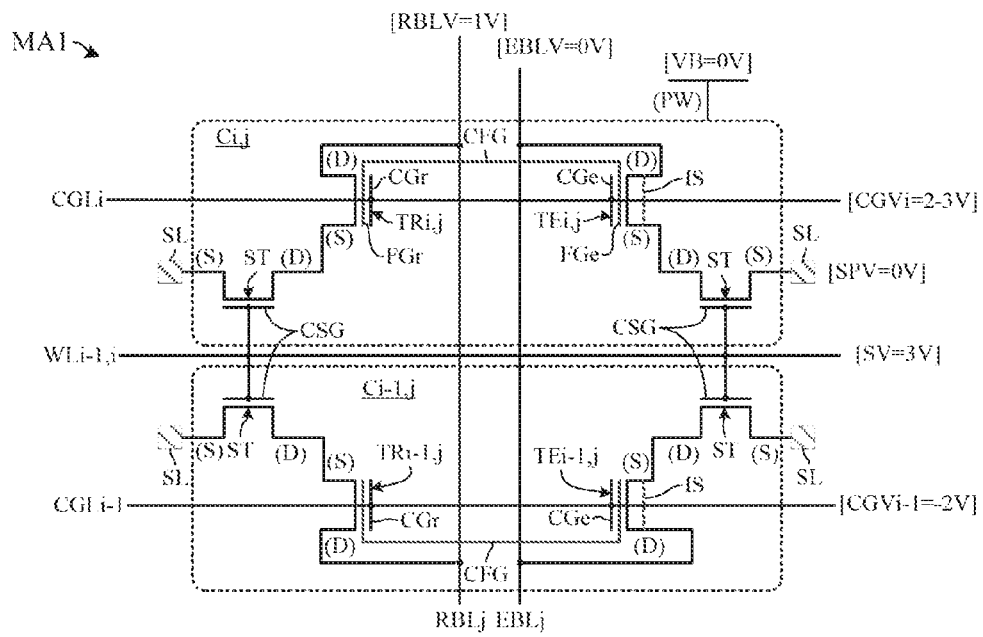
FIG. 13 shows voltages applied to the memory array in FIG. 2 to read a memory cell.
Figure 14:
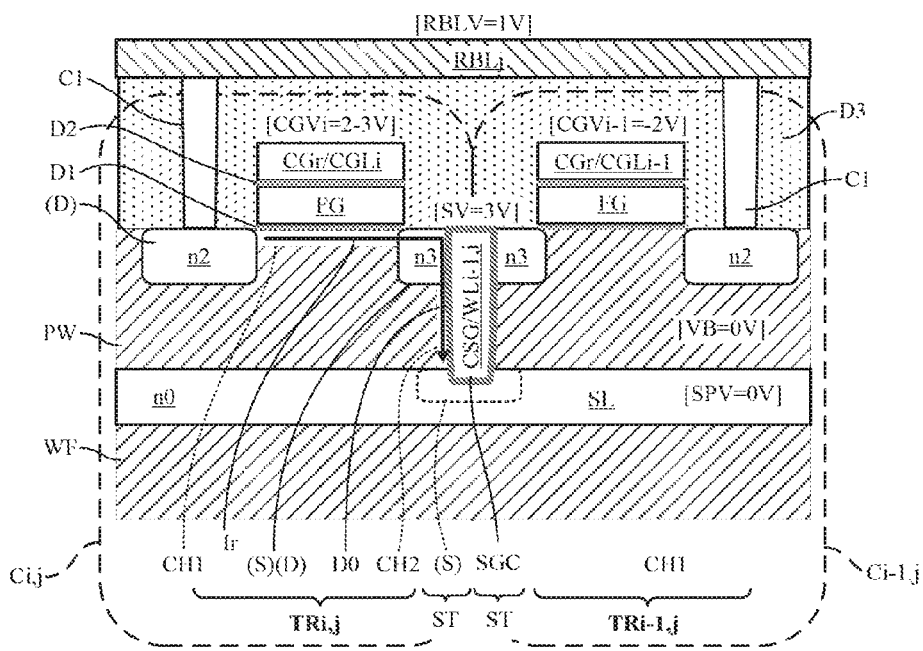
FIG. 14 is a cross-section of a memory cell in FIG. 13 and shows voltages applied to the memory cell.

FIGS. 13 and 14 show this reading method. FIG. 13 is the wiring diagram in FIG. 2 in which the voltage values contained in Table 4 have been entered. FIG. 14 is a cross-section of the transistors $TR_{i,j}$, $TR_{i-1,j}$ identical to that of FIG. 4, in which the voltage values contained in Table 4 have been entered.

The transistor $TR_{i,j}$ receives the positive voltage $CGV_i$ here 2 to 3V, that is lower than the threshold voltage of the programmed transistor but greater than the threshold voltage of the erased transistor. If the transistor $TR_{i,j}$ is in the erased state, i.e., if it has a threshold voltage Vt lower than the voltage CGV the conducting channel CH1 appears in the substrate PW, beneath the gate stack FG/CGr. The select transistor ST associated with the transistor $TR_{i,j}$ receives the positive select voltage SV, here 3V, on its embedded vertical gate CSG, and is in the on state, the vertical conducting channel CH2 appearing opposite the embedded gate CSG. As the bit line $RBL_j$ is taken to the positive voltage RBLV, here 1V, and the source line SL is coupled to the ground (0V), the transistor $TR_{i,j}$ is passed through by a read current Ir that circulates from the bit line to the source line. However, this current Ir is zero if the transistor $TR_{i,j}$ is in the programmed state, i.e., if it has a threshold voltage greater than the voltage $CGV_i$. A current amplifier (not represented) connected to the bit line $RBL_j$ enables the presence or absence of the current Ir to be detected, and the erased or programmed state of the transistor $TR_{i,j}$ can thus be deduced, to which a logical value, 0 or 1, is allocated by convention.

The transistor $TR_{i-1,j}$ of the twin memory cell receives the negative voltage $CGV_{i-1}$, here −2V. This transistor, if it is in the erased state, can have a threshold voltage close to zero. The application of a negative gate control voltage ensures that it remains in the off state. Indeed, as this transistor is connected to the same bit line $RBL_j$ as the transistor $TR_{i,j}$ being read, rendering it conducting could corrupt the reading of the transistor $TR_{i,j}$.

FIGS. 15 to 22 show steps of a method for manufacturing the memory cells $C_{i,j}$, $C_{i-1,j}$, described above. FIG. 15 shows a preliminary step of forming in the substrate PW three isolating trenches STI0, STI1, STI2 of STI type ("Shallow Trench Isolation") that delimit two strips of substrate S1, S2 in which the memory cells will be produced. This step is preceded by a step of implanting in the substrate the embedded layer n0 forming a source plane (not shown on the figure) or of implanting several source lines. A source plane is generally preferred to multiple source lines if it is provided to erase the memory cells by hot-electron injection.

During a step shown on FIG. 16, a conductive trench is formed transversally to the strips S1, S2, by etching the substrate, depositing the dielectric layer D0 (not shown) and depositing a polysilicon layer P0 and etching the latter. The trench is intended to form both the word line $WL_{i-1,i}$ and the embedded vertical control gate of the select transistors ST of the memory cells.

During a step shown on FIG. 17, the strip of substrate S2 is doped by implanting N-type dopants, the strip of substrate S1 being masked during this operation. This step makes it possible to produce the conducting region IS that will extend beneath the floating gate of the erase transistors $TE_{i,j}$, $TE_{i-1,j}$.

During a step shown on FIG. 18, the tunnel dielectric layer D1 described above is deposited on the substrate PW, then a strip of polysilicon P1, intended to form floating gates, is deposited on the strips of substrate S1 and S2.

Figure 19:
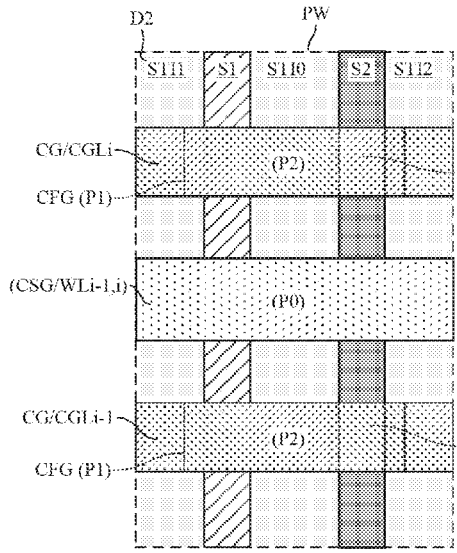

During a step shown on FIG. 19, the dielectric layer D2 is deposited on the substrate PW, then a polysilicon layer P2 is deposited on the layer D2. The layer P2 is then etched with the layer D2 as well as with the layer P1 to form the control gate lines $CGL_i$, $CGL_{i-1}$, and, beneath the latter, the common floating gates CFG, resulting from the simultaneous etching of the layer P1.

Figure 20:
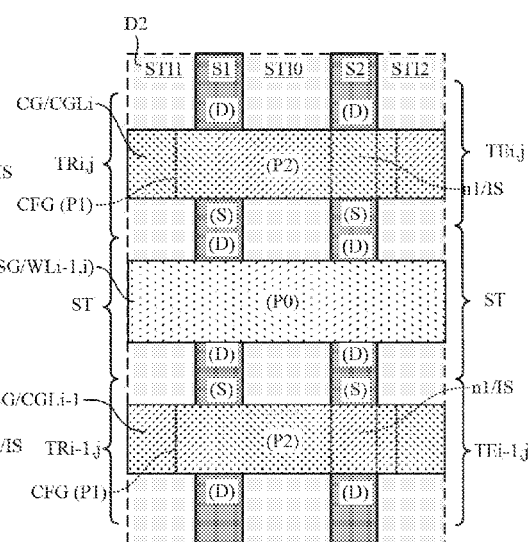

During a step shown on FIG. 20, the strips of substrate S1, S2 are doped by implanting dopants self-aligned with the control gate lines $CGL_i$, $CGL_{i-1}$ and with the word line $WL_{i-1,i}$ the strip of substrate S2 thus being doped a second time. This step generates the source S and drain D regions of the transistors $TR_{i,j}$, $TE_{i-1,j}$, $TE_{i,j}$, $TE_{i-1,j}$, and the drain regions of the select transistors ST.

Figure 21:
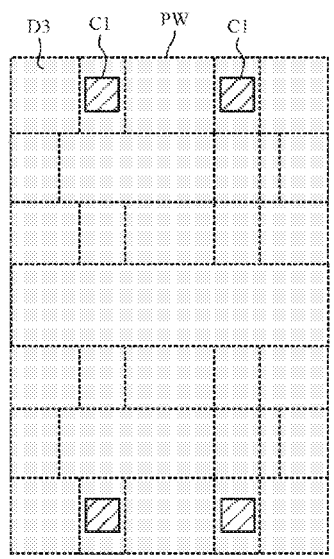

During a step shown on FIG. 21, the dielectric layer D3 is deposited on the substrate and orifices are made in the layer D3, then are metallized to form the contacts C1. Contacts C1 extend above the drain regions D of the transistors $TR_{i,j}$, $TR_{i-1,j}$ and others above the drain regions D of the transistors $TE_{i,j}$, $TE_{i-1,j}$.

Figure 22:
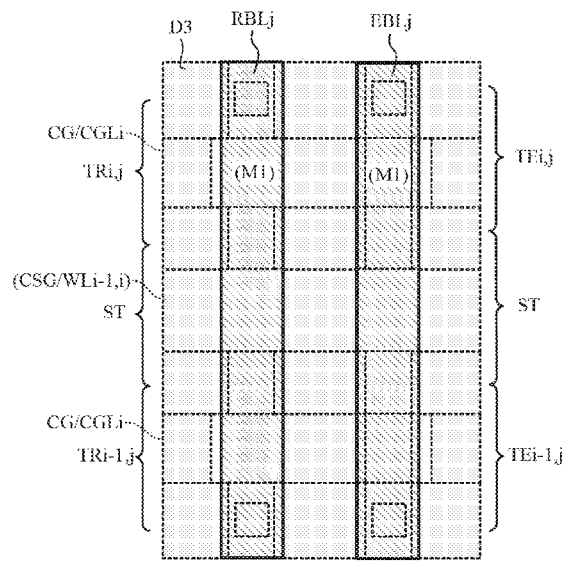

During a step shown on FIG. 22, a metal layer M1 ("metal 1") is deposited on the substrate, then is etched to obtain two conducting strips that form the bit lines $RBL_j$ and $EBL_j$, the former being arranged on the contacts C1 produced above the drain regions D of the transistors $TR_{i,j}$, $TR_{i-1,j}$ and the latter arranged on the contacts produced above the drain regions D of the transistors $TE_{i,j}$, $TE_{i-1,j}$.

Figure 23:
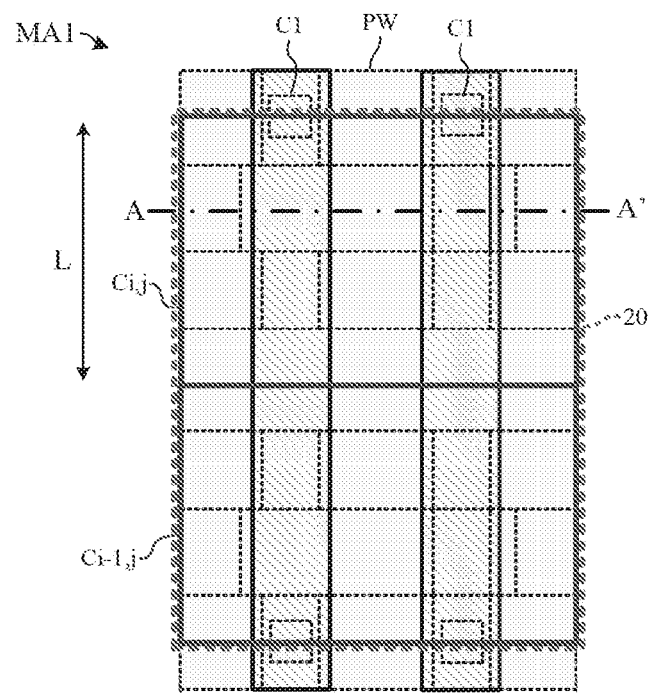

FIG. 23 is identical to FIG. 22 and shows the surface area occupied in width W and in length L by each memory cell $C_{i,j}$, $C_{i-1,j}$, the assembly forming a "basic brick" 20 of the memory array, containing two twin dual cells, the repetition of which enables a memory array MA1 of variable size chosen according to the intended application to be designed. The contacts C1 of the memory cell $C_{i,j}$ are in this case shared with a memory cell adjacent to this memory cell (not represented), and the same is true concerning the contacts C1 of the memory cell $C_{1-1,j}$. Thus, only half of the surface area occupied by each contact C1 is considered to be part of the "basic brick" 20.

Although these memory cells $C_{i,j}$, $C_{i-1,j}$ have a surface area that is twice those shown on FIG. 1, those skilled in the art will note that the semiconductor surface area they occupy barely differs from that occupied by conventional memory cells having planar-type select transistors that are not shared, due to the fact that the embedded vertical select gates considerably reduce their surface area and even more to the fact that they are shared.

Furthermore, according to one embodiment of the disclosure, a memory array according to the present disclosure may comprise a first memory area produced from memory cells as described on FIG. 1, forming a page-erasable mass memory, and a second memory area produced from memory cells according to the present disclosure, forming a bit- or word-erasable data memory, offering a finer erasing granularity than the mass memory and more suited to certain applications.

Figure 24:
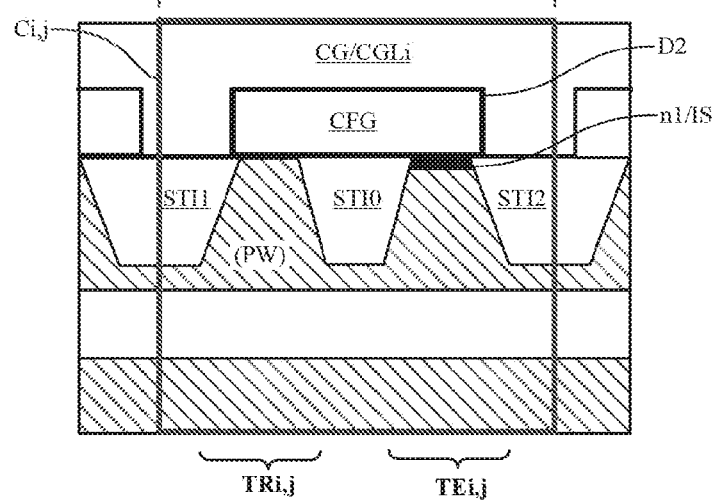

FIG. 24 is a cross-section of the memory cell $C_{i,j}$ according to a section plane AA' shown on FIG. 23 and perpendicular to the section plane of FIGS. 3 and 4, showing together the transistors $TR_{i,j}$, $TE_{i,j}$ and their common floating gate FGT. This figure also shows that it is possible to further reduce the width W of the memory cell by reducing the width of the central isolating trench STI0 that separates the transistors $TR_{i,j}$, $TE_{i,j}$, this isolating trench not needing to have the isolation width usually chosen for trenches STI1, STI2 that separate neighboring memory cells, since the transistors $TR_{i,j}$, $TE_{i,j}$ are electrically coupled.

Figure 25:
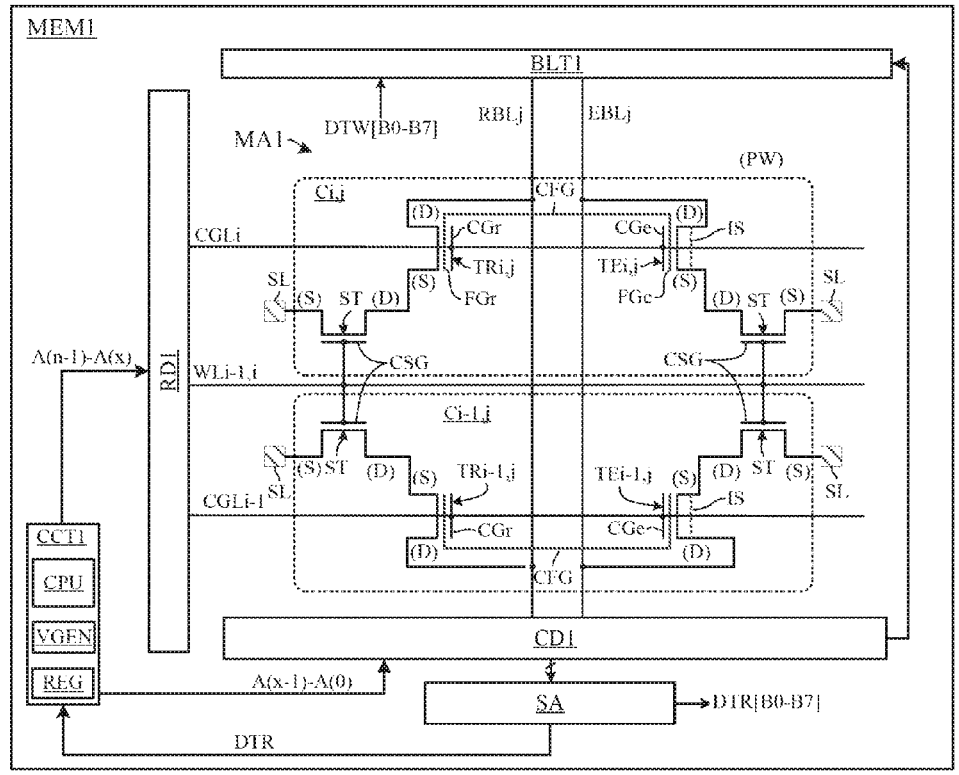
FIG. 25 is the wiring diagram of a memory comprising the memory array in FIG. 2.

FIG. 25 is the wiring diagram of a memory MEM1 comprising the memory array MA1 according to the present disclosure, only the cells $C_{i,j}$, $C_{i-1,j}$ being represented. The memory comprises a control circuit CCT1, a word line decoder RD1, a column decoder CD1, as many sense amplifiers SA as the number of bits of a word DTR to be read in the memory, for example an eight-bit word B0-B7, and programming latches BLT1 to apply voltages to the bit lines $RBL_j$ or $EBL_j$ according to a word DTW to be written in the memory, for example an eight-bit word B0-B7.

The word line decoder RD1 controls the voltages applied to the control gate lines $CGL_i$, $CGL_{i-1}$ and to the word line $WL_{i-1,j}$ according to a most significant address A(n-1)-A(x) of a word, or line address. The decoder CD1, in combination with the latches BLT1, controls the voltages applied to the bit lines $RBL_j$, $EBL_j$ according to a least significant address A(x-1)-A(0) of the word, or column address, the line and column addresses forming together the address A(n-1)-A0 of a word to be read or to be written in the memory array. In read mode, the decoder CD1 couples the sense amplifiers SA to the bit lines $RBL_j$ coupled to the memory cells to be read, and the sense amplifiers supply the word DTR.

The circuit CCT1 comprises for example a central unit CPU, a voltage generator VGEN, and address and data registers. It executes read or write commands, controls the decoders, supplies the voltages for the read and write operations (erasing-programming), provides the decoders with the most significant and least significant addresses, and if necessary executes a program for refreshing the memory cells.

Although the improvement that has just been described was initially designed to be applied to a memory cell structure of the type represented in FIG. 1, it will be understood by those skilled in the art that some embodiments of this improvement may be applied to other types of memory cells.

Figure 26:
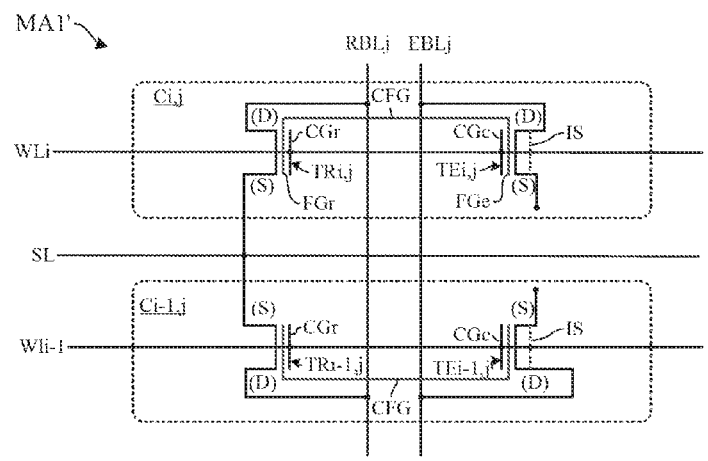
FIG. 26 is the wiring diagram of a second embodiment of a memory array and memory cell structure according to the first improvement.

As an example, FIG. 26 represents one embodiment of this improvement applied to memory cells without any select transistor. The memory array MA1' represented comprises memory cells $C_{i,j}$, $C_{i-1,j}$ each comprising a floating-gate transistor $TR_{i,j}$, respectively $TR_{i-1,j}$ and a floating-gate transistor $TE_{i,j}$, respectively $TE_{i-1,j}$, of the same structure as those described above. The transistor $TR_{i,j}$ has a drain terminal connected to the bit line $RBL_j$, a control gate CGr connected to the word line $WL_i$, and a source terminal directly connected to the source line SL. The transistor $TE_{i,j}$ comprises a drain terminal connected to the bit line $EBL_j$, a control gate CGr connected to the word line $WL_i$, and a non-connected source terminal. As above, the floating gate FGr of the transistor $TR_{i,j}$ is electrically coupled to the floating gate FGe of the transistor $TE_{i,j}$ and the latter comprises the conducting region IS opposite its floating gate, enabling the memory cell to be erased. The memory cell $C_{i-1,j}$ has an identical structure and the description above applies by replacing the index i with the index i-1.

Other alternatives could be provided, for example by removing the source terminal of the transistors $TE_{i,j}$, $TE_{i-1,j}$ in the embodiment in FIG. 26 or in the embodiment in FIG. 2, or by removing the select transistors ST associated with the transistors $TE_{i,j}$, $TE_{i-1,j}$ in the embodiment in FIG. 2.

Figure 27:
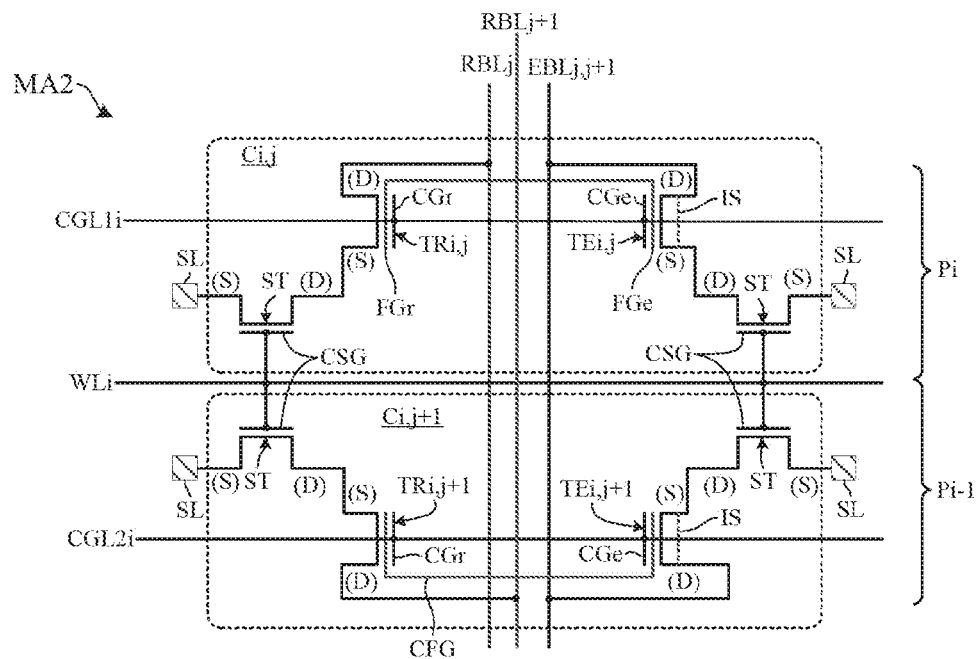
FIG. 27 is the wiring diagram of a first embodiment of a memory array and memory cell structure according to a second improvement according to the present disclosure.

FIG. 27 is the wiring diagram of a memory array MA2 comprising two memory cells $C_{i,j}$, $C_{i,j+1}$ according to a second improvement of the memory array and memory cell structure in FIG. 1, this improvement being implemented here in combination with the improvement previously described in connection with FIG. 2.

The memory cells are read- and write-accessible via a first bit line $RBL_j$, a second bit line $RBL_{j+1}$, a third bit line $EBL_{j,j+1}$, a word line $WL_i$ and two control gate lines $CGL1_i$, $CGL2_i$. The memory cell $C_{i,j}$ belongs to a physical page $P_i$ of the memory array and the memory cell $C_{i-1,j}$ belongs to an adjacent physical page $P_{i-1}$. The pages $P_i$, $P_{i-1}$ may comprise various other memory cells and the memory array MA1 may comprise various other pages.

In accordance with the previous improvement, the memory cell $C_{i,j}$ comprises two floating-gate transistors $TR_{i,j}$, $TE_{i,j}$ the floating gates FGr, FGe of which are interconnected, the floating-gate transistor $TR_{i,j}$ being dedicated to reading the transistor memory cell and the floating-gate transistor $TE_j$ being dedicated to erasing the memory cell. As above, the floating gates FGr, FGe may be formed by a same conducting element CFG and each transistor $TR_{i,j}$, $TE_{i,j}$ comprises a conducting region IS that extends opposite its floating gate through a tunnel oxide layer.

The transistor $TR_{i,j}$ has a control gate CGr connected to the control gate line $CGL1_i$, a drain terminal D connected to the bit line $RBL_j$ and a source terminal S connected to the drain terminal D of a select transistor ST the source terminal S of which is coupled to a source line SL. The floating-gate transistor $TE_{i,j}$ has a control gate CGe connected to the control gate line $CGL1_i$, a drain terminal D connected to the bit line $EBL_{j,j+1}$, and a source terminal S connected to the drain terminal D of a select transistor ST the source terminal S of which is coupled to a source line SL. The memory cell $C_{i,j+}$ has the same structure as the memory cell $C_{i,j}$ and comprises two floating-gate transistors $TR_{i,j+1}$, $TE_{i,j+1}$, the floating gates FGr, FGe of which are interconnected or formed by a same conducting element CFG. The transistor $TR_{i,j+1}$ has a control gate CGr connected to the control gate line $CGL2_i$, a drain terminal D connected to the bit line $RBL_{j+1}$ and a source terminal S connected to the drain terminal D of a select transistor ST the source terminal S of which is coupled to a source line SL. The floating-gate transistor $TE_{j+1}$ has a control gate CGe connected to the control gate line $CGL1_i$, a drain terminal D connected to the bit line $EBL_{j,j+1}$, and a source terminal S connected to the drain terminal D of a select transistor ST the source terminal S of which is coupled to a source line SL.

The select transistors ST associated with the floating-gate transistors $TR_{i,j}$, $TR_{i,j+1}$ have a common embedded vertical control gate CSG. Similarly, the select transistors ST associated with the floating-gate transistors $TE_{i,j}$, $TE_{i,j+1}$ have a common embedded vertical control gate CSG.

The memory array MA2 thus differs from the memory array MA1 in FIG. 2 in that the transistors $TR_{i,j}$, $TR_{i,j+1}$ of the twin memory cells $C_{i,j}$, $C_{i,j+1}$ are connected to different bit lines $RBL_j$, $RBL_{j+1}$. As will be seen below, these two bit lines enable a method for reading the memory cells to be implemented that does not require, when reading a memory cell, a negative voltage to be applied to the control gate line $CGL1_i$ or $CGL2_i$ of the twin memory cell.

It will first be noted that adding an extra bit line in a structure of two twin memory cells as represented in FIG. 1, involves increasing the surface area of the pair of memory cells, considered as "basic brick" of a memory array, because the latter does not enable two bit lines to be received. On the other hand, a structure of two twin dual memory cells of the type represented in FIG. 2 enables the two bit lines $RBL_j$, $RBL_{j+1}$ dedicated to reading the memory cells to be provided in addition to the bit line $EBL_{j,j+1}$ dedicated to erasing the memory cells, without increasing their surface area. This will be shown in connection with FIGS. 28 to 32, that show an alternative of the manufacturing method previously described for manufacturing a pair of memory cells forming a "basic brick" of the memory array, this alternative making it possible to produce the two bit lines $RBL_j$, $RBL_{j+1}$ instead of the bit line $RBL_j$ without increasing the surface area of the pair of memory cells.

The initial steps of the manufacturing method, described above in connection with FIGS. 15 to 21, are not modified. The step in FIG. 22 of manufacturing the bit lines $RBL_j$, $EBL_j$, is replaced with the step shown on FIG. 28.

Figures 28, 29:
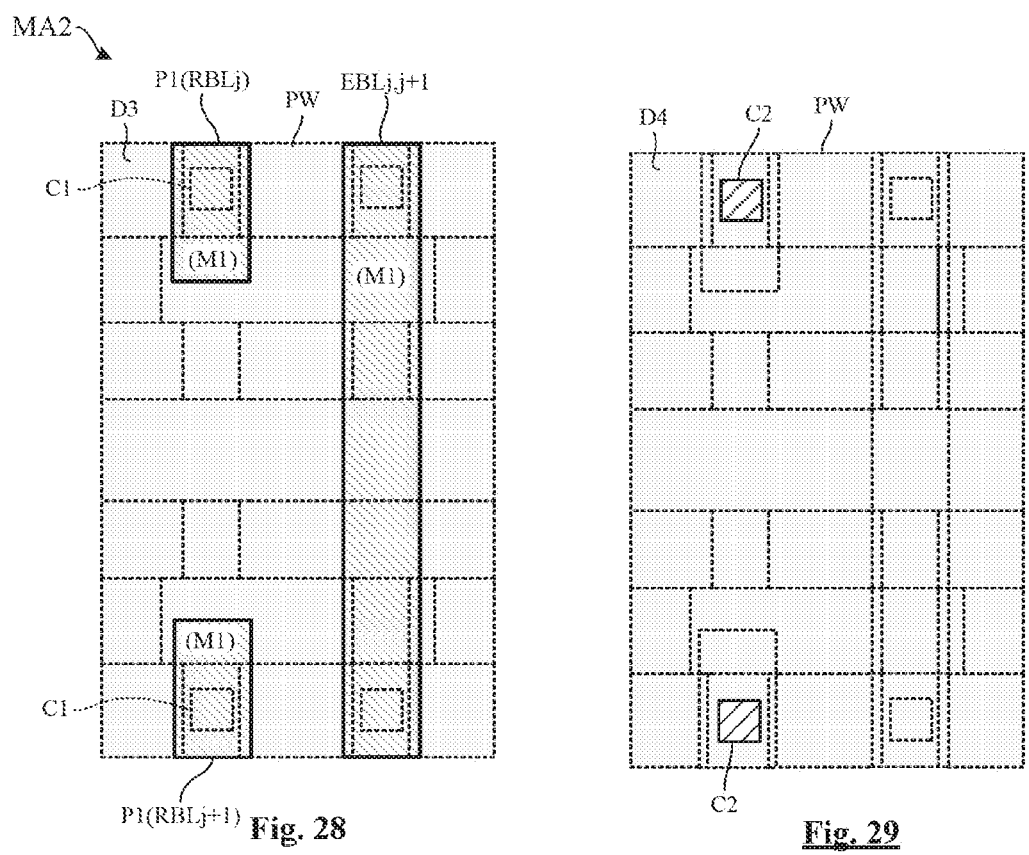

During the step in FIG. 28, a metal layer M1 ("metal 1") is deposited on the substrate, then etched to obtain firstly a conducting strip that forms here the bit line $EBL_{j,j+1}$ (previously referred to as $EBL_j$) and secondly two conducting rectangles parallel to the bit line $EBL_{j,j+1}$, that form two bit line sections $P1(RBL_j)$, $P1(RBL_{j+1})$. These two bit line sections extend above the contacts C1 that have been produced above the drain regions D of the transistors $TR_{i,j}$, $TR_{i,j+1}$ during the step shown on FIG. 21.

During a step shown on FIG. 29, a dielectric layer D4 is deposited on the substrate, and orifices are made in the layer D4 above the bit line sections $P1(RBL_j)$, $P1(RBL_{j+1})$, and are then metallized to form the contacts C2.

During a step shown on FIG. 30, a metal layer M2 ("metal 2") is deposited on the substrate, then etched to obtain two other conducting rectangles forming two bit line sections $P2(RBL_j)$, $P2(RBL_{j+1})$ perpendicular to the sections $P1(RBL_j)$, $P1(RBL_{j+1})$ and which extend above the contacts C2.

During a step shown on FIG. 31, a dielectric layer D5 is deposited on the substrate, and orifices are made in the layer D5 above the bit line sections $P2(RBL_j)$, $P2(RBL_{j+1})$, and are then metallized to form the contacts C3.

During a step shown on FIG. 32, a metal layer M3 ("metal 3") is deposited on the substrate, then etched to obtain two conducting strips that form the bit lines $RBL_j$ and $RBL_{j+1}$, the former being arranged on the contacts C3 coupled to the drain region D of the transistor $TR_{i,j}$, and the latter arranged on the contacts C3 coupled to the drain region D of the transistor $TR_{i,j+1}$. As shown in FIG. 32, the bit lines $RBL_j$ and $RBL_{j+1}$ are parallel to the bit line $EBL_{j,j+1}$, that is situated two metal levels below them, and the assembly fits into the template of the cells $C_{i,j}$, $C_{j+1}$ without requiring any increase in their surface area.

The memory cells are programmed and erased as described above. They are, however, read through the bit lines $RBL_j$, $RBL_{j+1}$ in a manner that is going to be described.

Readin of a Memory Cell Via a Bit Line $RBL_j$ or $RBL_{j+1}$

A method for reading the memory cell $C_{i,j}$ in FIG. 27 via the read transistor $TR_{i,j}$ and the bit line $RBL_j$ is described by Table 5 in the Annex.

Figure 33:
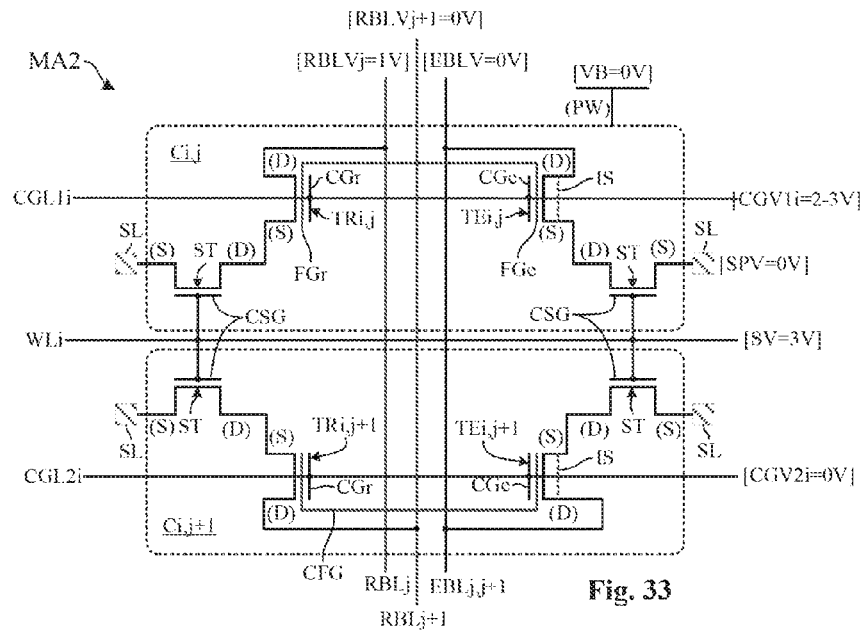
FIG. 33 shows voltages applied to the memory array in FIG. 27 to read a memory cell.

FIG. 33 is a wiring diagram identical to that in FIG. 27 in which the voltage values contained in Table 5 have been entered. The transistor $TR_{i,j}$ receives on its control gate the positive voltage $CGV1_i$, here 2 to 3V, and becomes on if it is in the erased state. The select transistor ST associated with the transistor $TR_{i,j}$ receives the positive select voltage SV on its control gate, here 3V, and is in the on state. As the bit line $RBL_j$ is taken to the positive voltage $RBLV_j$, here 1V, and the source line SL is coupled to the ground (0V), the transistor $TR_{i,j}$ is passed through by a read current Ir that circulates from the bit line to the source line. The transistor $TR_{i,j+1}$ of the twin memory cell receives the zero voltage $CGV2_i$. This transistor, if it is in the erased state, can have a threshold voltage close to zero, or even negative, and switch to the on state. Indeed, the bit line $RBL_{j+1}$ is not connected to any sense amplifier during the reading of the transistor $TR_{i,j}$ and the transistor $TR_{j+1}$ is not read. Thus, even in the absence of a negative voltage on the control gate line $CGL2_1$, the transistor $TR_{i,j+1}$ cannot corrupt the reading of the transistor $TR_{i,j}$, and vice-versa when reading the transistor $TR_{i,j+1}$.

Figure 34:
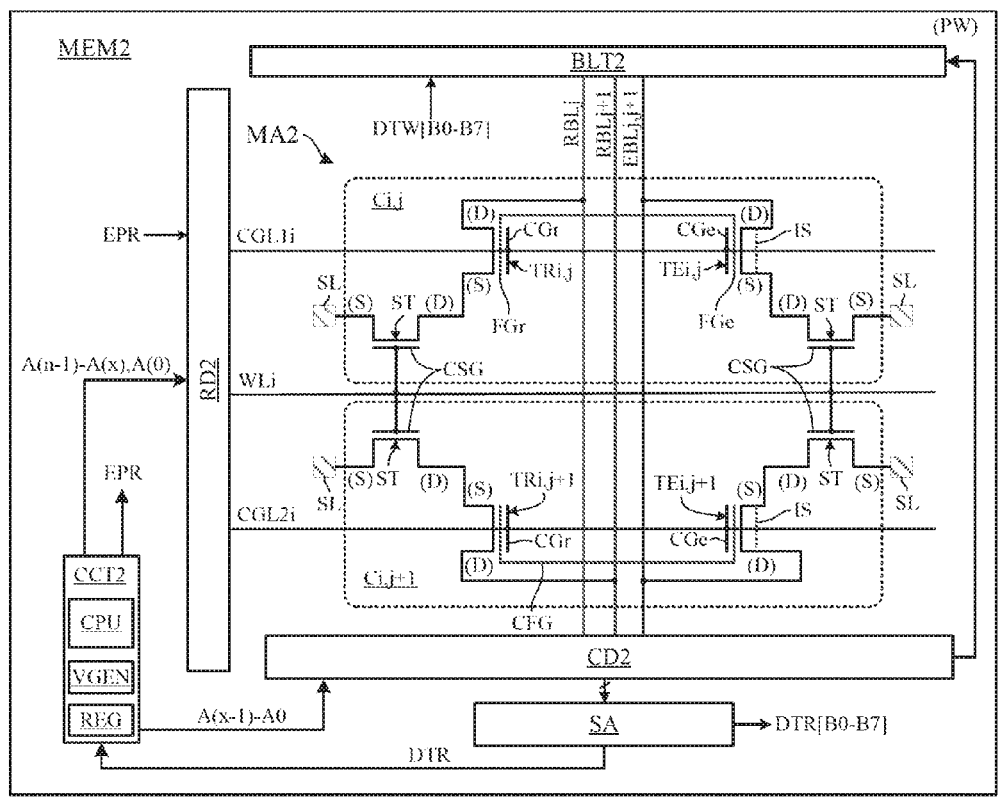
FIG. 34 is the wiring diagram of a memory comprising the memory array in FIG. 27.

FIG. 34 is the wiring diagram of a memory MEM2 comprising a memory array MA2 according to the present disclosure, only the cells $C_{i,j}$, $C_{i,j+1}$ being represented. The memory comprises a control circuit CCT2, a word line decoder RD2, a column decoder CD2, sense amplifiers SA and programming latches BLT2.

The word line decoder RD2 controls the voltages applied to the control gate lines $CGL1_i$, $CGL2_i$ and to the word line WL, according to a most significant address A(n-1)-A(x) of a word (line address). The decoder CD2, in combination with the latches BLT1, controls the voltages applied to the bit lines $RBL_j$, $RBL_{j+1}$, $EBL_{j,j+1}$ according to the column address A(x-1)-A(0) of the word. In read mode, the decoder CD2 couples the sense amplifiers SA to the bit lines $RBL_j$ connected to the memory cells that must be read, and the sense amplifiers supply a word DTR read in the memory, for example of 8 bits B0-B7. The circuit CCT2 comprises, like the circuit CCT1 previously described, a central unit CPU, a voltage generator VGEN, and address and data registers. It executes read or write commands, controls the decoders, supplies the voltages for the read and write operations (erasing-programming), provides the most significant and least significant addresses, and if necessary executes a program for refreshing the memory cells.

According to one embodiment, the word line decoder RD2 is configured to be able to distinctly control the voltages applied to the twin control gate lines $CGL1_i$, $CGL2$ which here have the same most significant address A(n-1)-A(x). This distinct control of the voltages can be reserved for the erasing operations, to apply a positive voltage to these memory cells situated on a twin page of the one containing the memory cell(s) being erased (Cf. FIGS. 6 and 7). However, in read mode, the decoder may apply the same voltage to the twin control gate lines $CGL1_i$, $CGL2_i$ or even to all the control gate lines of the memory array to limit the logic gate switches and thus limit the current consumption of the memory, because the memory cells are read-selected by means of the word lines WL.

In such an embodiment, the decoder RD2 receives, in addition to the most significant address A(n-1)-A(x) of a word, the least significant bit A(0) of the least significant address A(x-1)-A(0) of the word. The decoder RD2 also receives from the circuit CCT2 an information signal EPR that indicates to it whether the address decoding to be done occurs in the context of reading, erasing or programming memory cells. If the decoding occurs in the context of erasing, the decoder RD2 differentiates the two control gate lines $CGL1_i$, $CGL2_i$ according to the bit A(0). In other words, the decoder RD2 selects the control gate line $CGL1_i$ if the bit line $RBL_j$ is designated by the full address received by the memory, or selects the control gate line $CGL2_i$ if the bit line $RBL_{j+1}$ is designated by the full address received by the memory. In one equivalent alternative, the decoder may receive a signal from the column decoder CD2, indicating to it which of the two control gate lines must be selected. Those skilled in the art may naturally provide other embodiments of the decoder, aiming for example to distinctly control the voltages applied to the twin control gate lines $CGL1_i$, $CGL2_i$ in reading, programming and erasing mode.

Although the second improvement that has just been described was initially designed to be applied to a memory cell structure according to the first improvement, as shown on FIG. 2, it will be understood by those skilled in the art that some embodiments of this second improvement may be applied to other types of memory cells.

Figure 35:
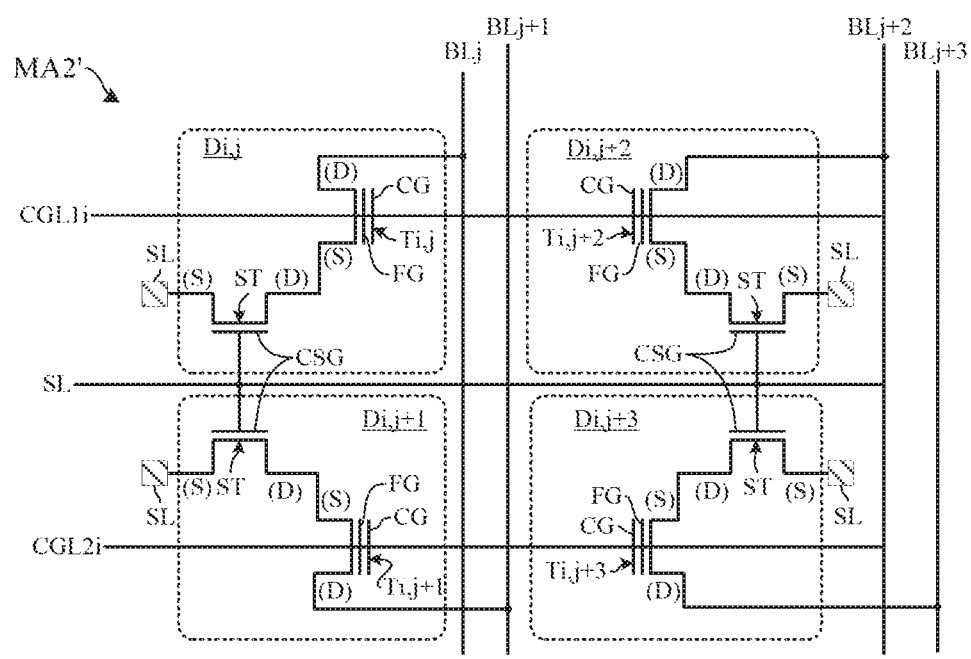
FIG. 35 is the wiring diagram of a second embodiment of a memory array and memory cell structure according to the second improvement.

As an example, FIG. 35 shows an example of application of the second improvement to the memory cell structure represented in FIG. 1, and shows a memory array MA2' comprising four memory cells $D_{i,j}$, $D_{i,j+1}$, $D_{i,j+1}$, $D_{i,j+3}$ of the same structure and the same arrangement as the cells $M_{i,j}$, $M_{i-1,j}$, $M_{i,j+1}$, $M_{i-1,j+1}$ in FIG. 1, but considered as being part of the same logic page, i.e., having the same most significant address. The memory cells $D_{i,j}$, $D_{i,j+1}$ are thus twin memory cells and share the same select gate CSG. The memory cells $D_{i,j+2}$, $D_{i,j+3}$ are twin memory cells and share the same select gate CSG. The control gates of the floating-gate transistors $T_{i,j}$, $T_{i,j+2}$ of the memory cells $D_{i,j}$, $D_{i,j+2}$ are connected to the control gate line $CGL1_i$ and the control gates of the floating-gate transistors $T_{i,j+1}$, $T_{i,j+3}$ of the memory cells $D_{i,j-1}$, $D_{i,j+3}$ are connected to the control gate line $CGL2_i$. The drain terminals of the twin memory cells $D_{i,j}$, $D_{i,j+1}$, instead of being connected to the same bit line, are connected to different bit lines $BL_j$, $BL_{j+1}$. Similarly, the drain terminals of the twin memory cells $D_{i,j+2}$, $D_{i,j+3}$, instead of being connected to the same bit line, are connected to different bit lines $BL_{j+2}$, $BL_{j+3}$.

ANNEX

TABLE 1

Fowler Nordheim erasing of $C_{i,j}$ via $TE_{i,j}$, FIGS. 5 and 6

| Ref. | Description | Sign | Example |
|---|---|---|---|
| $CGV_i$ | Erase voltage applied to the control gate $CGL_i$ of the transistors $TR_{i,j}$, $TE_{i,j}$ of the memory cell $C_{i,j}$ (erase-selected memory cell) via the control gate line $CGL_i$ | negative | −8 V |
| $CGV_{i-1}$ | Erase-inhibit voltage applied to the control gate $CGL_{i-1}$ of the transistors $TR_{i-1,j}$, $TE_{i-1,j}$ of the memory cell $C_{i-1,j}$ (twin memory cell not erase-selected) via the control gate line $CGL_i$ | positive | 3 V |
| EBLV | Erase voltage applied to the bit line $EBL_j$ | positive | 6 V |
| RBLV | Voltage applied to the bit line $RBL_j$ | — | HZ* |
| SV | Select voltage applied to the word line $WL_{i-1,j}$ common to the twin memory cells $C_{i-1,j}$, $C_{i,j}$ | — | 0 V |
| SPV | Source line voltage applied to all the source lines SL (or to the source plane) | — | 0 V |
| VB | Electric potential of the substrate PW | — | 0 V |
| CGV* | Default voltage applied to all the other control gate lines CGL | positive | 3 V |
| EBLV* | Default voltage applied to the non-selected bit lines EBL | — | 0 V |
| RBLV* | Default voltage applied to a non-selected bit line RBL (for example "$RBL_{j+1}$") | — | 0 V |
| SV* | Voltage applied to the non-selected word lines WL | — | 0 V |

*High impedance, i.e., line disconnected from the rest of the circuit

TABLE 2

Fowler Nordheim programming of $C_{i,j}$ via $TE_{i,j}$, FIGS. 8 and 9

| Ref. | Description | Sign | Example |
|---|---|---|---|
| $CGV_i$ | Voltage applied to the control gate $CGL_i$ of the transistors $TR_{i,j}$, $TE_{i,j}$ of the memory cell $C_{i,j}$ (program-selected memory cell) via the control gate line $CGL_i$ | positive | 14 V |
| $CGV_{i-1}$ | Voltage applied to the control gate $CGL_{i-1}$ of the transistors $TR_{i-1,j}$, $TE_{i-1,j}$ of the memory cell $C_{i-1,j}$ (twin memory cell not program-selected) via the control gate line $CGL_i$ | positive | 3 V |
| EBLV | Voltage applied to the bit line $EBL_j$ | — | 0 V |
| RBLV | Voltage applied to the bit line $RBL_j$ | — | HZ |
| SV | Select voltage applied to the word line $WL_{i-1,i}$ common to the twin memory cells $C_{i-1,j}$, $C_{i,j}$ | — | 0 V |
| SPV | Source line voltage applied to all the source lines SL (or to the source plane) | — | 0 V |
| VB | Electric potential of the substrate PW | — | 0 V |
| CGV* | Voltage applied to all the other control gate lines CGL | positive | 3 V |
| EBLV* | Voltage applied to the non-selected bit lines EBL | — | 6 V |
| RBLV* | Voltage applied to the non-selected bit lines RBL | — | HZ |
| SV* | Voltage applied to the non-selected word lines WL | — | 0 V |

TABLE 3

Programming of $C_{i,j}$ by injection, via $TR_{i,j}$, FIGS. 11 and 12

| Ref. | Description | Sign | Example |
|---|---|---|---|
| $CGV_i$ | Voltage applied to the control gate $CGL_i$ of the transistors $TR_{i,j}$, $TE_{i,j}$ of the memory cell $C_{i,j}$ (program-selected memory cell) via the control gate line $CGL_i$ | positive | 10 V |
| $CGV_{i-1}$ | Voltage applied to the control gate $CGL_{i-1}$ of the transistors $TR_{i-1,j}$, $TE_{i-1,j}$ of the memory cell $C_{i-1,j}$ (twin memory cell not program-selected) via the control gate line $CGL_i$ | — | 0 V |
| EBLV | Voltage applied to the bit line $EBL_j$ | — | 0 V or more |
| RBLV | Voltage applied to the bit line $RBL_j$ | positive | 4 V |
| SV | Select voltage applied to the word line $WL_{i-1,i}$ common to the twin memory cells $C_{i-1,j}$, $C_{i,j}$ | positive | 1-2 V |
| SPV | Source line voltage applied to all the source lines SL (or to the source plane) | — | 0 V |
| VB | Electric potential of the substrate PW | — | 0 V |
| CGV* | Voltage applied to all the other control gate lines CGL | — | 0 V |
| EBLV* | Voltage applied to the non-selected bit lines EBL | — | 0 V |
| RBLV* | Voltage applied to the non-selected bit lines RBL | — | 0 V |
| SV* | Voltage applied to the non-selected word lines WL | — | 0 V |

TABLE 4

Reading of $C_{i,j}$ via $TR_{i,j}$, FIG. 13 and 14

| Ref. | Description | Sign | Example |
|---|---|---|---|
| $CGV_i$ | Voltage applied to the control gate $CGL_i$ of the transistors $TR_{i,j}$, $TE_{i,j}$ of the memory cell $C_{i,j}$ (read-selected memory cell) via the control gate line $CGL_i$ | positive | 2-3 V |
| $CGV_{i-1}$ | Voltage applied to the control gate $CGL_{i-1}$ of the transistors $TR_{i-1,j}$, $TE_{i-1,j}$ of the memory cell $C_{i-1,j}$ (twin memory cell not read-selected) via the control gate line $CGL_i$ | negative | −2 V |
| EBLV | Voltage applied to the bit line $EBL_j$ | — | 0 V |
| RBLV | Voltage applied to the bit line $RBL_j$ | positive | 1 V |
| SV | Select voltage applied to the word line $WL_{i-1,i}$ common to the twin memory cells $C_{i-1,j}$, $C_{i,j}$ | positive | 3 V |
| SPV | Source line voltage applied to all the source lines SL (or to the source plane) | — | 0 V |
| VB | Electric potential of the substrate PW | — | 0 V |
| CGV* | Voltage applied to all the other control gate lines CGL | — | 0 V |
| EBLV* | Voltage applied to the non-selected bit lines EBL | — | 0 V |
| RBLV* | Voltage applied to the non-selected bit lines RBL | — | 0 V |
| SV* | Voltage applied to the non-selected word lines WL | — | 0 V |

TABLE 5

Reading of $C_{i,j}$ via $TR_{i,j}$ and $RBL_j$, FIG. 33

| Ref. | Description | Sign | Example |
|---|---|---|---|
| $CGV1_i$ | Voltage applied to the control gate $CGL1_i$ of the transistors $TR_{i,j}$, $TE_{i,j}$ of the memory cell $C_{i,j}$ (read-selected memory cell) via the control gate line $CGL1_i$ | positive | 2-3 V |
| $CGV2_i$ | Voltage applied to the control gate $CGL2_i$ of the transistors $TR_{i,j+1}$, $TE_{i,j+1}$ of the memory cell $C_{i,j+1}$ (twin memory cell not read-selected) via the control gate line $CGL2_i$ | — | 0 V |
| EBLV | Voltage applied to the bit line $EBL_{j,j+1}$ | — | 0 V |
| $RBLV_j$ | Voltage applied to the selected bit line $RBL_j$ of the pair of memory cells | positive | 1 V |
| $RBLV_{j+1}$ | Voltage applied to the non-selected bit line $RBL_{j+1}$ of the pair of memory cells | — | 0 V |

TABLE 5-continued

Reading of $C_{i,j}$ via $TR_{i,j}$ and $RBL_j$, FIG. 33

| Ref. | Description | Sign | Example |
|---|---|---|---|
| SV | Select voltage applied to the word line $WL_i$ common to the twin memory cells $C_{i,j+1}$, $C_{i,j}$ | positive | 3 V |
| SPV | Source line voltage applied to all the source lines SL (or to the source plane) | — | 0 V |
| VB | Electric potential of the substrate PW | — | 0 V |
| CGV* | Voltage applied to all the other control gate lines CGL | — | 0 V |
| EBLV* | Voltage applied to the non-selected bit lines EBL | — | 0 V |
| RBLV* | Voltage applied to the non-selected bit lines RBL | — | 0 V |
| SV* | Voltage applied to the non-selected word lines WL | — | 0 V |

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   manufacturing on a semiconductor substrate a memory cell that includes:
   a first floating-gate transistor having a control gate, a floating gate, and a drain region;
   a second floating-gate transistor having a control gate, a floating gate, and a drain region, wherein:
   the floating gates of the first and second floating-gate transistors are electrically coupled to each other, and the second floating-gate transistor comprises:
   a tunnel dielectric layer extending along the floating gate of the second floating-gate transistor; and
   a permanently conductive region electrically coupled to the drain region of the second floating-gate transistor and extending along an opposite side of the tunnel dielectric layer with respect to the floating gate of the second floating-gate transistor, the method comprising:
   forming in the substrate isolating trenches delimiting first and second strips of the substrate,
   making the second strip permanently conductive by doping the second strip,
   forming a first dielectric layer on the substrate and forming the floating gate of the first floating gate transistor on the first dielectric layer, the floating gate being arranged transversally to the two strips of substrate,
   forming a second dielectric layer on the floating gate of the first floating gate transistor and forming the control gate of the first floating gate transistor on the floating gate with of the first floating gate transistor, to obtain a gate stack, and
   doping the first and second strips of substrate on opposite sides of the gate stack, thereby generating drain and source regions of the first floating-gate transistor and a drain region of the second floating-gate transistor, the permanently conducting region opposite the floating gate of the second floating-gate transistor being formed by a region of the second strip, which is doped before forming the gate stack.

2. The manufacturing method according to claim 1, comprising forming in the substrate a conductive trench arranged transversally to the first and second strips and forming, after doping the first and second strips, an embedded vertical gate of a select transistor of the memory cell.

3. A method, comprising:
   erasing a non-volatile memory cell on a semiconductor substrate, the memory cell including a first floating-gate transistor comprising a control gate, a floating gate, a tunnel dielectric layer between the floating gate and the substrate, a drain region and a source region, the erasing including:
   applying a negative electric potential difference between a control gate and a drain region of a second floating-gate transistor that also includes a floating gate, a tunnel dielectric layer, and a permanently conductive region electrically coupled to the drain region of the second floating-gate transistor and extending on an opposite side of the tunnel dielectric layer with respect to the floating gate of the second floating-gate transistor, the applying including extracting negative electric charges from the floating gate of the second floating-gate transistor through the permanently conductive region.

4. The method according to claim 3, wherein:
   the drain region of the first floating-gate transistor electrically coupled to a first bit line,
   the drain region of the second floating-gate transistor is electrically coupled to a second bit line,
   the control gates of the first and second floating-gate transistors are electrically coupled to a control gate line, and
   applying the negative electric potential difference between the control gate and the drain region of the second floating-gate transistor includes applying the negative electric potential difference through the control gate line and the second bit line.

5. A method, comprising:
   forming first and second floating-gate transistors of first and second memory cells, respectively, the forming of the first and second floating-gate transistors including:
   forming a plurality of isolation trenches in a substrate, first and second portions of the substrate separating the plurality of isolation trenches from each other;
   forming a conductive trench in the plurality of isolation trenches and the first and second portions of the substrate;
   forming first and second conductive regions on opposite sides of the conductive trench by doping the first portion of the substrate;
   forming a first dielectric layer on the first and second conductive regions;

forming first and second floating gates on the first dielectric layer; and forming source and drain regions by doping the first and second portions of the substrate.

6. The method of claim 5, wherein the isolation trenches are extending in a first direction, and the conductive trench is extending in a second direction that is substantially perpendicular to the first direction.

7. The method of claim 5, further comprising:
forming a third floating-gate transistor of the first memory cell, the third floating-gate transistor having a third floating gate; and forming a fourth floating-gate transistor of the second memory cell, the fourth floating-gate transistor having a fourth floating gate.

8. The method of claim 7, further comprising electrically coupling the third and fourth floating gates to the first and second floating-gates, respectively.

9. The method of claim 5, further comprising:
forming a second dielectric layer on the first and second floating gates; and forming control gate lines on the second dielectric layer.

10. The method of claim 9, wherein the forming of the control gate lines includes:
forming a conductive layer on the second dielectric layer; and removing portions of the conductive layer and the second dielectric layer.

11. The method of claim 9, further comprising:
forming a third dielectric layer on the substrate and the control gate lines; and forming conductive vias electrically coupled to the source and drain regions in the third dielectric layer.

12. The method of claim 11, further comprising forming bit lines electrically coupled to the conductive vias on the third dielectric layer.

* * * * *